United States Patent
Janssens

(10) Patent No.: US 9,590,499 B2
(45) Date of Patent: Mar. 7, 2017

(54) DRIVE CIRCUIT AND METHOD

(71) Applicant: Semiconductor Components Industries, LLC, Phoenix, AZ (US)

(72) Inventor: Johan Camiel Julia Janssens, Asse (BE)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 53 days.

(21) Appl. No.: 14/751,370

(22) Filed: Jun. 26, 2015

(65) Prior Publication Data

US 2016/0020697 A1 Jan. 21, 2016

Related U.S. Application Data

(60) Provisional application No. 62/026,280, filed on Jul. 18, 2014.

(51) Int. Cl.
*H02M 3/158* (2006.01)
*H02M 3/07* (2006.01)
(Continued)

(52) U.S. Cl.
CPC ............ *H02M 3/07* (2013.01); *H01L 41/042* (2013.01); *H02M 2003/071* (2013.01); *H04R 3/00* (2013.01)

(58) Field of Classification Search
CPC ..... G05F 1/40; G05F 1/44; G05F 1/56; G05F 1/59; H02M 3/155; H02M 3/156; H02M 3/158; H03K 19/096
(Continued)

(56) References Cited

U.S. PATENT DOCUMENTS 5,293,169 A * 3/1994 Baumgartner ........ H03M 3/488
330/51
5,914,632 A * 6/1999 Fotouhi .................. H02M 3/07
327/390
(Continued)

FOREIGN PATENT DOCUMENTS

DE 2012012183 A1 12/2013

OTHER PUBLICATIONS

Simple Methods Reduce Input Ripple for All Charge Pumps, Publication No. Tutorial 2027, http://www.maximintegrated.com/en/app-notes/index.mvp/id/2027, Published May 13, 2003 (7 pages).
(Continued)

*Primary Examiner* — Adolf Berhane
(74) *Attorney, Agent, or Firm* — Rennie William Dover

(57) ABSTRACT

In accordance with an embodiment, a transformer-less drive circuit is provided that includes a switch control network having an output terminal connected to a first switch and another output terminal connected to a second switch. A driver connected to the second switch. In accordance with another embodiment, a method for generating a drive signal is provided that includes charging a first energy storage element to a first voltage level and a second energy storage element to a second voltage level. The charge stored in the second energy storage element is increased so that the second energy storage element stores a voltage at a third voltage level. The terminals of the second energy storage element are alternately connected to a fourth voltage level. The second energy storage element is used to supply or drive a driver.

18 Claims, 7 Drawing Sheets

(51) Int. Cl.
*H01L 41/04* (2006.01)
*H04R 3/00* (2006.01)

(58) Field of Classification Search
USPC .... 323/265, 268, 271, 282, 283; 326/93, 95, 326/96
See application file for complete search history.

(56) References Cited

U.S. PATENT DOCUMENTS

| | | | | |
|---|---|---|---|---|
| 5,982,105 | A * | 11/1999 | Masters | H05B 33/08 |
| | | | | 315/169.3 |
| 6,301,322 | B1 * | 10/2001 | Manning | G11C 19/00 |
| | | | | 326/94 |
| 7,427,884 | B2 * | 9/2008 | Kimura | G09G 3/20 |
| | | | | 327/199 |
| 7,649,130 | B2 | 1/2010 | Spirkl et al. | |
| 7,843,237 | B2 | 11/2010 | Strzalkowski et al. | |
| 8,217,597 | B2 | 7/2012 | Sun et al. | |
| 2002/0031193 | A1 * | 3/2002 | Harrison | G11C 7/1072 |
| | | | | 375/340 |
| 2009/0140903 | A1 * | 6/2009 | Edwards | H03M 1/002 |
| | | | | 341/150 |
| 2013/0114614 | A1 * | 5/2013 | Tran | H04L 12/10 |
| | | | | 370/401 |

OTHER PUBLICATIONS

DC-DC Conversion Without Inductors, Publication No. Tutorial 725, http://www.maximintegrated.com/en/app-notes/index.mvp/id/725, Published Jul. 22, 2009 (9 pages).
Charge Pumps, http://www.maximintegrated.com/en/products/power/charge-pumps.html, Published 2015 (1 page).
Charge Pump Circuits: An Overview on Design Strategies and Topologies, Publication IEEE Circuits and Systems Magazine, Published First Quarter 2010 (15 pages).

* cited by examiner

DRIVE CIRCUIT AND METHOD

BACKGROUND

The present invention relates, in general, to electronics and, more particularly, to drive circuits and methods.

In the past, the semiconductor industry used transformers, inductors, or H-bridges in high voltage driver applications. For example, the driver solutions often included transformers to boost the voltage amplitude or they employed inductors to create inductive boosting of signals using resonance, impedance transformations, power matching, etc. Transformers and inductors are expensive components. In addition, supply voltages can vary widely or suffer from transients, e.g., a battery voltage may dip during thermal engine start. H-bridges are used for their amplitude per volt supply. However, these devices are highly susceptible to system ESD and EMC events. This occurs when a transducer is exposed or unprotected.

Accordingly, it would be advantageous to have a semiconductor component and method for providing high voltage drive capability that is hardened against electrostatic discharge (ESD) and electromagnetic compatibility (EMC) events. It would be of further advantage for the semiconductor component and method to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
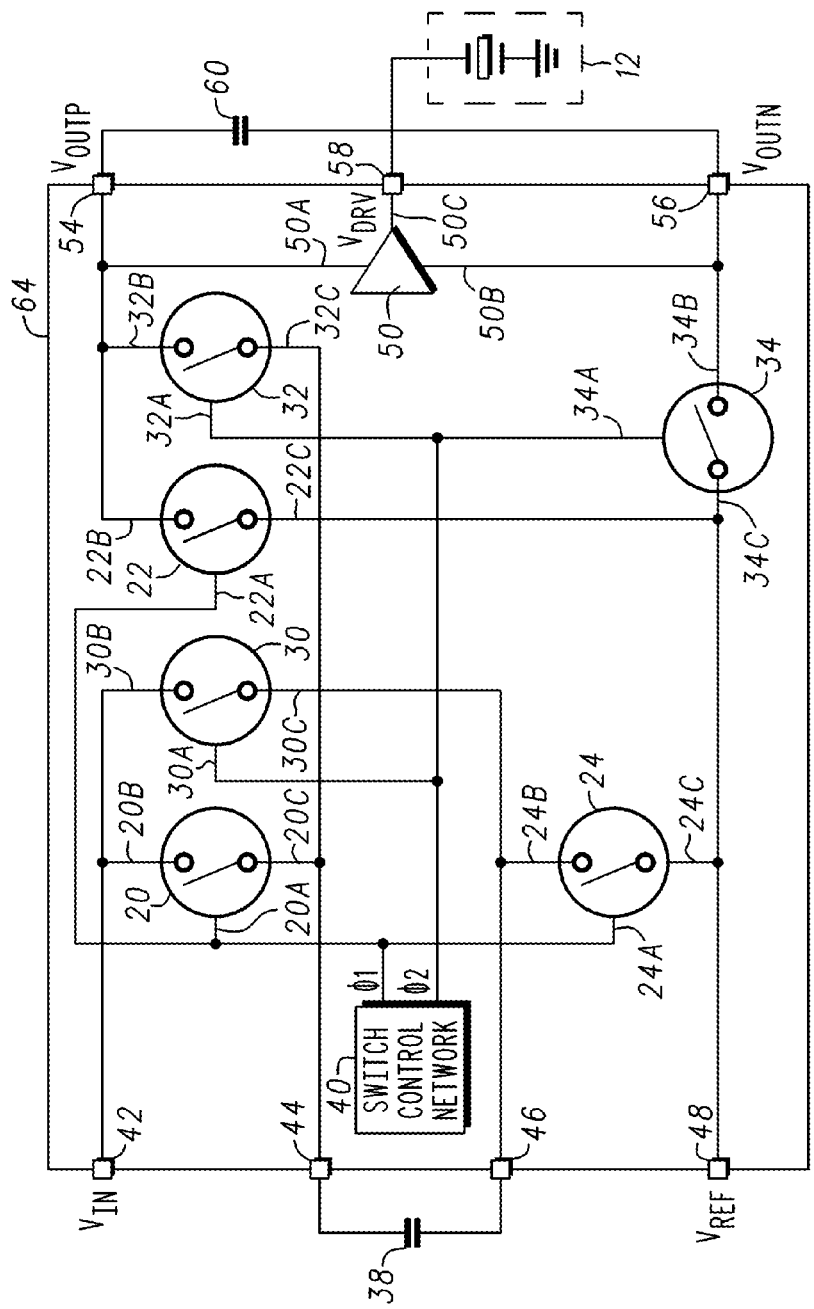
FIG. 1 is a schematic diagram of a drive circuit in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low, a logic low voltage or logic low voltage level and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high, a logic high voltage level, a logic high voltage, or a logic one voltage and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally the present invention provides a transformerless drive circuit that includes a switch control network 40 configured to have an output terminal for transmitting a clock signal or drive signal Φ1 and an output terminal for transmitting a clock signal or drive signal Φ2. The drive circuit further includes switches 24 and 32 and a driver 50. Switch 24 has a control terminal 24A coupled for receiving drive signal Φ1 and switch 32 has a control terminal coupled for receiving drive signal Φ2. Driver 50 has an input 50A connected to a conduction terminal 32B of switch 32.

In accordance with an aspect, the transformer-less drive circuit further includes a switch 34 having a control terminal 34A coupled for receiving drive signal Φ2 from switch control network 40 and a conduction terminal 34B connected to an input terminal 50B of driver 50, wherein a conduction terminal 34C of switch 34 is connected to a conduction terminal 24C of switch 24.

In accordance with another aspect, the transformer-less drive circuit further includes switch 20 having a control terminal 20A coupled for receiving drive signal Φ1 from switch control network 40, a conduction terminal 20B coupled for receiving an input signal $V_{IN}$, and a conduction terminal 20C connected to a conduction terminal 32C of switch 32.

In accordance with another aspect, the transformer-less drive circuit further includes switch 30 having a control terminal 30A coupled for receiving a drive signal Φ2 from switch control network 40 and a conduction terminal 30C connected to conduction terminal 24B of switch 24.

In accordance with another aspect, the transformer-less drive circuit further includes a switch 22 having a control terminal 22A coupled for receiving a drive signal Φ1 from switch control network 40, a conduction terminal 22B commonly connected to conduction terminal 32B of switch 32 and input 50A of driver 50, and conduction terminal 22C connected to conduction terminal 34 C of switch 34.

In accordance with another aspect, the transformer-less drive circuit further includes an energy storage elements 38 and 60, wherein energy storage element 38 has a terminal connected to conduction terminal 24B of switch 24 and a terminal connected to conduction terminal 32C of switch 32 and energy storage element 60 has a terminal connected to input 50A of driver 50 and a terminal connected to input 50B of driver 50.

In accordance with another aspect, the transformer-less drive circuit 100 further includes a switch 134 having a control terminal 134A and conduction terminals 134B and 134C. Control terminal 134A is coupled for receiving drive signal Φ2 from switch control network 40, conduction terminal 134B is connected to a conduction terminal of a switch 126 and for receiving an input voltage $V_{IN}$, and a conduction terminal 134C connected to input 50A of driver 50.

In accordance with another aspect, the transformer-less drive circuit 100 further includes a switch 126 having a control terminal 126A coupled for receiving a drive signal Φ1, a conduction terminal 126B connected to a conduction terminal 134B of a switch 134 and a conduction terminal 126C coupled to the conduction terminal 130B of a switch 130.

In accordance with another aspect, the transformer-less drive circuit 100 further includes a switch 132 having a control terminal 130A coupled for receiving a drive signal Φ2 of a switch control circuit 40, a conduction terminal 132B connected to a conduction terminal 120B of a switch 120, and a conduction terminal 132C connected to a second input 50B of a driver 50.

In accordance with another aspect, the transformer-less drive circuit 100 further includes a switch 124 and a switch 122. Switch 124 has a control terminal coupled for receiving a drive signal Φ1PD of a switch control network 40, a conduction terminal 124B connected to an input 50A of a driver 50 and a second conduction terminal 124C coupled for receiving a reference voltage. Switch 122 has a control terminal 122A coupled for receiving a control signal Φ1PU from switch control network 40, a conduction terminal 122B coupled for receiving the source of operating potential $V_{REF}$, and a conduction terminal connected to the second input 50B of the driver 50.

In accordance with another embodiment, a transformer-less drive circuit 150 is provided that includes a switch control network 40 configured to have an output terminal for transmitting a clock signal or drive signal Φ1 and an output terminal for transmitting a clock signal or drive signal Φ2. The drive circuit further includes switches 24 and 32 and a driver 151. Switch 24 has a control terminal 24A coupled for receiving drive signal Φ1 and switch 32 has a control terminal coupled for receiving drive signal Φ2. Driver 151 has an input coupled for receiving driver signal Φ1 and an input coupled for receiving drive signal Φ2. Driver circuit 150 further includes switches 34, 20, and 22, driver switches 12 and 154, and current sources 156 and 158.

Switch 34 has a control terminal 34A coupled for receiving a drive signal Φ2 from switch control network 40, a conduction terminal 34B connected to current source 158, and a conduction terminal 34C coupled the conduction terminal 24C of switch 24 and for receiving a reference voltage $V_{REF}$. Switch 20 has a control terminal 20A coupled for receiving a drive signal Φ1 from switch control network 40, a conduction terminal 20B coupled for receiving an input voltage $V_{IN}$, and a conduction terminal 20C coupled to the conduction terminal 32C of switch 32. Switch 30 has a control terminal 30A coupled for receiving a drive signal Φ2 from switch control network 40, a conduction terminal 30B coupled for receiving an input voltage $V_{IN}$, and a conduction terminal 30C coupled to the conduction terminal 24B of switch 24. Switch 22 has a control terminal 22A coupled for receiving a drive signal Φ1 from switch control network 40, a conduction terminal 22B coupled to a current source 156, and a conduction terminal 22C coupled to the conduction terminal 34C of switch 34.

Driver 151 includes driver switches 152 and 154 and current limiters 156 and 158. Driver switch 152 has a control terminal coupled for receiving a drive signal Φ2 that serves as a clock input signal. Driver switch 154 has a control terminal 154A coupled for receiving a drive signal Φ1 that serves as another clock input signal, and a conduction terminal 154B connected to conduction terminal 152C of driver switch 152. Current limiter 156 has a terminal connected to conduction terminal 32B of switch 32 and a terminal connected to conduction terminal 152B of switch 152. Current limiter 158 has a terminal connected to conduction terminal 34B of switch 34 and a terminal connected to conduction terminal 154C of switch 154.

In accordance with another embodiment, transformer-less and inductor-less drive circuit 200 includes a switch control network 40 configured to have an output terminal for transmitting a clock signal or drive signal Φ1 and an output terminal for transmitting a clock signal or drive signal Φ2. Drive circuit 200 further includes switches 24 and 32 and a driver 50. Switch 24 has a control terminal 24A coupled for receiving drive signal Φ1 and switch 32 has a control terminal coupled for receiving drive signal Φ2. Driver 50 has an input 50A connected to a conduction terminal 32B of switch 32. In addition, drive circuit 200 includes switches 34, 20, 30, and 22. Switch 34 has a control terminal 34A coupled for receiving a drive signal Φ2, a conduction terminal connected to input terminal 50B of driver 50, and a conduction terminal coupled for receiving a reference voltage $V_{REF2}$. Switch 20 has a control terminal 20A coupled for receiving a drive signal Φ1, a conduction terminal 20B coupled for receiving an input voltage $V_{IN}$, and a conduction terminal 20C connected to conduction terminal 32C of switch 32 connected to input terminal 50B of driver 50, and a conduction terminal coupled for receiving a first reference voltage. Switch 30 has a control terminal 30A coupled for receiving a drive signal Φ2, a conduction terminal 30B coupled for receiving another input voltage $V_{IN1}$, and a conduction terminal 30C connected to conduction terminal 24B of switch 24. Switch 22 has a control terminal 22A coupled for receiving a drive signal Φ1, a conduction terminal 22B connected to input 50A of driver 50, and a conduction terminal 22C coupled for receiving a reference voltage $V_{REF1}$.

In accordance with another embodiment, a method is provided for generating a drive signal that comprises configuring a plurality of switches 20, 22, 24, 30, 32, and 34 to place an input voltage $V_{IN}$ voltage at a node 44, a voltage $V_{REF}$ at a node 46, and a voltage $V_{REF}$ at a node 54. Then the plurality of switches 20, 22, 24, 30, 32, and 34 are configured to place input voltage $V_{IN}$ at the node 46, a voltage $2*V_{IN}$ at the node 44 and the node 54, and a voltage at a node 56. Then the plurality of switches 20, 22, 24, 30, 32, and 34 are configured to place input voltage $V_{IN}$ at the node 44, voltage $V_{REF}$ at the node 46, and voltage $V_{IN}$ at the node 54, and a voltage $-2*V_{IN}$ at the node 56.

In accordance with an aspect, configuring the plurality of switches 20, 22, 24, 30, 32, and 34 to place the input voltage $V_{IN}$ at node 44 and the reference voltage $V_{REF}$ at the node 46 includes placing a first difference voltage across a capacitor 38 equal to a difference between the input voltage $V_{IN}$ and reference voltage $V_{REF}$.

In accordance with another embodiment, a method for generating a drive signal includes charging a first energy storage element to store a voltage at a first voltage level and a second energy storage element to store a voltage at a second voltage level. Increasing the charge stored in the second energy storage element so that the second energy storage element stores a voltage at a third voltage level. The voltage at the terminals of the second energy storage element are alternately set to a voltage level VREF in response to alternately setting the voltages to voltage level to nodes 54 and 56 to which the terminals of the energy storage element are connected.

FIG. 1 is a circuit schematic of a transformer-less drive circuit 10 suitable for driving a circuit 12 in accordance with an embodiment of the present invention. Circuit 12 may be, for example, a transducer, a sensor, a piezoelectric device, an actuator, or a load which may be comprised of a circuit or a circuit element that has a capacitive or resistive behavior at low frequencies. It should be noted that transformer-less drive circuit 10 is suitable for driving control terminals of semiconductor devices to initiate a switching action in these devices and the drive circuit may be referred to as a driver circuit. Examples of such semiconductor devices include the gates of NDMOS devices, GaN HEMT devices, depletion mode devices, etc. What is shown in FIG. 1 is a switching network comprising switches 20, 22, and 24 driven by a clocking signal Φ1 and a switching network comprising switches 30, 32, and 34 driven by a clocking signal Φ2. Clocking signals Φ1 and Φ2 are generated by a switch control network 40. Each switch 20, 22, 24, 30, 32, and 34 has a control terminal and a pair of current conducting terminals. The control terminals 20A, 22A, and 24A of switches 20, 22, and 24, respectively, are coupled for receiving clocking signal Φ1 and the control terminals 30A, 32A, and 34A of switches 30, 32, and 34, respectively, are coupled for receiving clocking signal Φ2. Current conducting terminals 20B and 30B of switches 20 and 30, respectively, are connected to an input pin 42, current conducting terminals 20C and 32C of switches 20 and 32, respectively, are connected to an input pin 44; current conducting terminals 30C and 24B of switches 30 and 24, respectively, are connected to an input pin 46, and current conducting terminals 22C, 24C, and 34C of switches 22, 24, and 34, respectively, are connected to an input pin 48. Input pin 42 is coupled for receiving an input voltage $V_{IN}$, input pin 48 is coupled for receiving a reference voltage $V_{REF}$, input pin 44 is coupled to one terminal of a capacitor 38 and input pin 46 is connected to the other terminal of capacitor 38. Input pins 42, 44, 46, and 48 may be referred to as input terminals, input leads, or inputs.

Current conducting terminals 22B and 32B of switches 22 and 32, respectively, are connected to an output pin 54 and current conducting terminal 34B of switch 34 is connected to an output pin 56. Circuit 10 further includes a driver 50 having inputs 50A and 50B and an output 50C, wherein input 50A is connected to current conducting terminals 22B and 32B and output pin 54 and input 50B is connected to current conducting terminal 34B and output pin 56. Output terminal 50C is connected to output pin 58 and provides a drive signal $V_{DRV}$ to circuit 12. An output voltage $V_{OUTP}$ appears at output pin 54 and an output voltage $V_{OUTN}$ appears at output pin 56. A capacitor 60 has a terminal connected to output pin 54 and a terminal connected to output pin 56. In accordance with an embodiment, a voltage $V_{OUT}$ appears across capacitor 60, where voltage $V_{OUT}$ is substantially equal to a difference between voltage $V_{OUTP}$ and voltage $V_{OUTN}$, i.e., $V_{OUT}=V_{OUTP}-V_{OUTN}$. Output pins 54, 56, and 58 also may be referred to as output terminals, output leads, or outputs.

It should be noted that the connectivity between switch control network 40 and control terminals 20A, 22A, 24A, 30A, 32A, and 34A of switches 20, 22, 24, 30, 32, and 34, respectively, shown in FIG. 1 indicate that control terminals 20A, 22A, 24A, 30A, 32A, and 34A are being controlled logically by the signals Φ1 and Φ2 from control network 40. The connections from switch control network 40 to control terminals 20A, 22A, 24A, 30A, 32A, and 34A of switches 20, 22, 24, 30, 32, and 34, respectively, is not intended to imply that all nets are connected to the same node or are electrically at the same potential. Control network 40 may communicate the logical signals to 20A, 22A, 24A, 30A, 32A, and 34A of switches 20, 22, 24, 30, 32, and 34, respectively, wherein level shifters may be included to convert the drive signals to a desired level to activate and deactivate switches 20, 22, 24, 30, 32, and 34, i.e., the polarity of the gate voltage for switches comprised of field effect transistors depends of the transistor type (n-channel or p-channel). It should be further noted that transformer-less and inductor-less drive circuit 10 is shown as being monolithically integrated in a package 64 having input pins 42, 44, 46, and 48 and output pins 54, 56, and 58.

In operation, switches 20, 22, and 24 are opened and closed in response to a clock signal Φ1 and switches 30, 32, and 34 are opened and closed in response to a clock signal Φ2. It should be noted that for the sake of clarity, reference voltage $V_{REF}$ is assumed to be equal to ground. However, this is not a limitation and reference voltage $V_{REF}$ can be at a voltage level other than ground. In addition, the units for the various voltages is volts; however, this is not a limitation and the units may be millivolts, kilovolts, etc. In accordance with embodiments in which reference voltage $V_{REF}$ does not equal ground, the voltage equations are adjusted accordingly. In response to clock signal Φ1 being high, clock signal Φ2 being low, and bias voltage $V_{REF}$ being at ground, capacitor 38 is precharged to input voltage $V_{IN}$, output pin 54 is connected to ground, i.e., voltage $V_{REF}$, and the voltage on output pin 56 is driven to a voltage substantially equal to $-2*V$ (assuming the voltage \T$_{our}$ across capacitor 60 is substantially equal to $2*V_{IN}$), and the output range of drive signal $V_{DRV}$ of driver 50 at output pin 58 ranges from a voltage substantially equal to $-2*V_{IN}$ to substantially a ground voltage, i.e., voltage $V_{DRV}$ is greater than $-2*V_{IN}$ and less than 0 volts or a ground potential or voltage. Configuring switches 20, 22, and 24 to be closed in response to clock signal Φ1 being high, i.e., a logic high state, and configuring switches 30, 32, and 34 to be open in response to clock signal Φ2 being low, i.e., a logic low state places transformer-less and inductor-less drive circuit 10 in a down/iso configuration.

In response to clock signal Φ2 being high, clock signal Φ1 being low, and bias voltage $V_{REF}$ being at ground, capacitor 60 is incrementally charged to a voltage $V_{OUT}$ which is substantially equal to $2*V_{IN}$, i.e., the voltage of output pin 54 is substantially equal to $2*V_{IN}$, output pin 56 is connected to a voltage equal to ground, i.e., reference voltage $V_{REF}$, and the output range of drive signal $V_{DRV}$ of driver 50 at output pin 58 ranges from a voltage substantially equal to ground to a voltage substantially equal to $2*V_{IN}$, i.e., voltage $V_{DRV}$ is greater than or equal to 0 volts and less than or equal to $+2*V_{IN}$. Configuring switches 20, 22, and 24 to be open in response to clock signal Φ1 being low, i.e., a logic low state, and configuring switches 30, 32, and 34 to be closed in response to clock signal Φ2 being high, i.e., a logic high state, places transformer-less and inductor-less drive circuit 10 in an up/double charge configuration. Briefly referring to FIG. 2, a plot 70 graphically shows the voltage at output pin 54, i.e., output voltage $V_{OUTP}$, and briefly referring to FIG. 3 a plot 72 graphically shows the voltage at output pin 56, i.e., output voltage $V_{OUTN}$.

It should be appreciated that driver 50 may generate a drive signal $V_{DRV}$ that ranges from substantially $-2*V_{IN}$ to substantially $+2*V_{IN}$ by adjusting the values of voltages $V_{OUTP}$, $V_{OUTN}$, and $V_{DRV}$. For example, in response to voltage $V_{DRV}$ being approximately equal to voltage $V_{OUTP}$, or a logic low voltage, or voltage $V_{DRV}$ being approximately equal to output voltage $V_{OUTN}$, and in accordance with switches 22 and 34 are open or closed.

Thus, transformer-less and inductor-less drive circuit 10 may be referred to as a multi-mode voltage driver or a $4*V_{SUP}$ driver, wherein transformer-less and inductor-less drive circuit 10 may be configured as a doubler, a configurable grounded output circuit, or a configurable multi-voltage level output driver. For example, in a doubler configuration switches 20, 24, 30, 32, and 34 may be configured so that drive circuit 10 is capable of asymptotically creating a voltage approximately equal to $2*V_{IN}$ across capacitor 60 where output voltage $V_{OUT}$ is substantially equal to voltage $V_{OUTP}$ minus voltage $V_{OUTN}$ ($V_{OUTP}-V_{OUTN}$), which is approximately equal to a voltage of $2*V_{IN}$. For reasons of clarity in the above explanation, bias voltage $V_{REF}$ is at ground. When $V_{REF}$ is not ground, voltage $V_{OUT}$ across capacitor 60 asymptotically approaches a voltage equal to $2*(V_{IN}-V_{REF})$.

In the configurable grounded output circuit configuration, output pins 54 and 56 are alternately coupled for receiving a ground potential, i.e., output voltages $V_{OUTP}$ and $V_{OUTN}$ are alternately connected to ground potential. In response to output pin 54 being connected to ground, output voltage $V_{OUTP}$ is substantially equal to ground, output voltage $V_{OUTN}$ substantially equals voltage $V_{OUTP}$ minus voltage $V_{OUT}$, i.e., $V_{OUTP}-V_{OUT}$, resulting in voltage $V_{OUTN}$ on output pin 56 being substantially equal to $-2$ times $V_{IN}$, i.e., $-2*V_{IN}$. In response to output pin 56 being connected to ground, i.e., reference voltage $V_{REF}$ being equal to ground, output voltage $V_{OUTN}$ substantially equals ground, output voltage $V_{OUTP}$ substantially equals voltage $V_{OUTN}$ plus voltage $V_{OUT}$, i.e., $V_{OUTP}=V_{OUTN}+V_{OUT}$, resulting in voltage $V_{OUTP}$ on output pin 54 being substantially equal to $+2$ times $V_{IN}$ ($+2*V_{IN}$). For the sake of clarity in the above explanation, bias voltage $V_{REF}$ is assumed to be at ground. In response to reference voltage $V_{REF}$ not being ground, output voltage $V_{OUT}$ across capacitor 60 can asymptotically approach a voltage equal to $2*(V_{IN}-V_{REF})$, voltage $V_{OUTP}$ can be as high as a voltage equal to $2*V_{IN}-V_{REF}$, and voltage $V_{OUTN}$ can be as low as a voltage equal to $-2*(V_{IN}-V_{REF})+V_{REF}$.

In the configurable multi-voltage level output driver configuration, output pin 58 supplies a voltage between (or substantially equal to) the voltages supplied on output pins 54 and 56.

Figure 2:
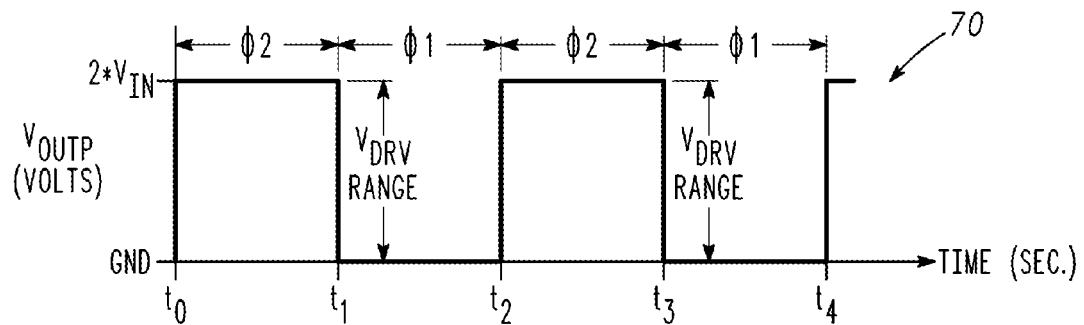
FIG. 2 is a timing diagram illustrating an output voltage of the drive circuit of FIG. 1 in accordance with another embodiment of the present invention.
Figure 3:
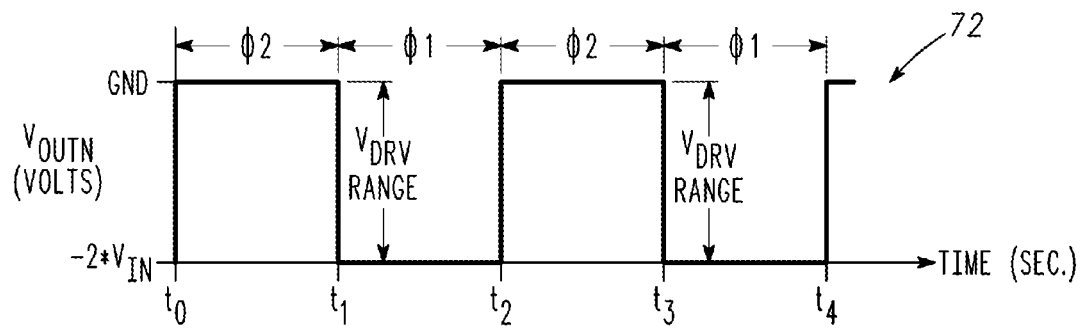
FIG. 3 is a timing diagram illustrating an output voltage of the drive circuit of FIG. 1 in accordance with another embodiment of the present invention.

FIG. 2 is a timing diagram 70 that illustrates a voltage on output pin 54 in response to clock signals Φ1 and Φ2 switching between logic high and logic low voltage levels and FIG. 3 is a timing diagram 72 that illustrates a voltage on output pin 56 in response to clock signals Φ1 and Φ2 switching between logic high and logic low voltage levels in accordance with an embodiment of the present invention. For the sake of clarity, FIGS. 2 and 3 are described together. Between times $t_0$ and $t_1$ clock signal Φ1 is at a logic low voltage level and clock signal Φ2 is at a logic high voltage level. Switches 20, 22, and 24 are open in response to clock signal Φ1 being at a logic low voltage level and switches 30, 32, and 34 are closed in response to clock signal Φ2 being at a logic high voltage level. Closing switch 30 connects voltage $V_{IN}$ at input pin 42 to the terminal of capacitor 38 that is connected to input pin 46; closing switch 32 connects the voltage $V_{OUTP}$ at output pin 54 to the terminal of capacitor 38 that is connected to input pin 44; closing switch 34 connects reference voltage $V_{REF}$ at pin 48 to output pin 56 thereby setting output voltage $V_{OUTN}$ and the voltage at input 50B of driver 50 to be substantially equal to reference voltage $V_{REF}$; opening switch 20 disconnects input pin 42 from the terminal of capacitor 38 that is connected to input pin 44; opening switch 22 disconnects reference voltage $V_{REF}$ at input pin 48 from output pin 54 and from input 50A of driver 50; and opening switch 24 disconnects voltage $V_{REF}$ at input pin 48 from input pin 46 and terminal 30C of switch 30. It should be noted that one terminal of capacitor 60 is connected to output pin 56 and the other terminal of capacitor 60 is connected to output pin 54 and that the voltage across capacitor 60 is the voltage from output pin 54 to output pin 56. In this configuration, the voltage $V_{OUTP}$ at output pin 54 is the voltage at input pin 46, i.e., voltage $V_{IN}$, plus the voltage across capacitor 38, which can range from 0 volts to a voltage equal to the difference between voltage $V_{IN}$ and $V_{REF}$, i.e., $V_{IN}-V_{REF}$. Thus, the voltage at output pin 54 can range from voltage $V_{IN}$ to a voltage equal to 2 times voltage $V_{IN}$ minus reference voltage $V_{REF}$, i.e., $+2*V_{IN}-V_{REF}$. Accordingly, the voltage across capacitor 60 can range from zero to a voltage equal to $+2*(V_{IN}-V_{REF})$. In accordance with embodiments in which voltage $V_{REF}$ is ground, the voltage across capacitor 60 can range from ground to $+2*V_{IN}$. In accordance with embodiments in which voltage $V_{REF}$ is ground, FIG. 2 illustrates that between times $t_0$ and $t_1$ the voltage $V_{OUTP}$ at output pin 54 can be substantially equal to $+2*V_{IN}$ and FIG. 3 illustrates that between times $t_0$ and $t_1$ the voltage $V_{OUTN}$ at output pin 56 can be substantially equal to ground.

Between times $t_1$ and $t_2$ clock signal Φ1 is at a logic high voltage level and clock signal Φ2 is at a logic low voltage level. Switches 20, 22, and 24 are closed in response to clock signal Φ1 being at a logic high voltage level and switches 30, 32, and 34 are open in response to clock signal Φ2 being at a logic low voltage level. Closing switch 20 connects voltage $V_{IN}$ at input pin 42 to the terminal of capacitor 38 connected to input pin 44; closing switch 22 connects reference voltage $V_{REF}$ at pin 48 to output pin 54 thereby setting output voltage $V_{OUTP}$ to be substantially equal to reference voltage $V_{REF}$; and closing switch 24 connects voltage $V_{REF}$ at input pin 48 to the terminal of capacitor 38 connected to input pin 46 and to terminal 30C of switch 30; opening switch 30 disconnects voltage $V_{IN}$ at input pin 42 from the terminal of capacitor 38 connected to input pin 46; opening switch 32 disconnects the voltage $V_{OUTP}$ at output pin 54 from the terminal of capacitor 38 connected to input pin 44; and opening switch 34 disconnects reference voltage $V_{REF}$ at input pin 48 from the voltage $V_{OUTN}$ at output pin 56 and from input 50B of driver 50. It should be noted that one terminal of capacitor 60 is connected to output pin 56 and the other terminal of capacitor 60 is connected to output pin 54 and that the voltage across capacitor 60 is the voltage from output pin 54 to output pin 56. In accordance with this configuration, the voltage $V_{OUTN}$ at output pin 56 is the voltage at input pin 48, i.e., reference voltage $V_{REF}$, minus the voltage across capacitor 60, which can range from 0 volts to a voltage equal to $2*(V_{IN}-V_{REF})$. Thus, the voltage at output pin 56 can range from voltage $V_{REF}$ to a voltage equal to $-2*(V_{IN}-V_{REF})+V_{REF}$. Accordingly, the voltage across capacitor 60 can range from voltage equal to substantially 0 volts to a voltage equal to $-2*(V_{IN}-V_{REF})$. In accordance with embodiments in which voltage $V_{REF}$ is ground, the voltage on pin 56 can range from ground to $-2*V_{IN}$. In accordance with embodiments in which reference voltage $V_{REF}$ is ground, FIG. 2 illustrates that between times $t_1$ and $t_2$ the voltage $V_{OUTP}$ at output pin 54 can range from ground or ground potential to $+2*V_{IN}$ and FIG. 3 illustrates that voltage $V_{OUTN}$ at output pin 56 can range from ground or ground potential to $-2*V_{IN}$. When reference $V_{REF}$ is not at ground potential between times $t_1$ and $t_2$, the voltage $V_{OUTP}$ at output pin 54 can range from reference voltage $V_{REF}$ to a voltage substantially equal to $+2*V_{IN}-V_{REF}$ and the voltage $V_{OUTN}$ at output pin 56 can range from reference voltage $V_{REF}$ to a voltage substantially equal to $-2*(V_{IN}-V_{REF})+V_{REF}$.

Between times $t_2$ and $t_3$ clock signal Φ1 is at a logic low voltage level and clock signal Φ2 is at a logic high voltage level. Switches 20, 22, and 24 are open in response to clock signal Φ1 being at a logic low voltage level and switches 30, 32, and 34 are closed in response to clock signal Φ2 being at a logic high voltage level. Closing switch 30 connects voltage $V_{IN}$ at input pin 42 to the terminal of capacitor 38 that is connected to input pin 46; closing switch 32 connects the voltage $V_{OUTP}$ at output pin 54 to the terminal of capacitor 38 that is connected to input pin 44; closing switch 34 connects reference voltage $V_{REF}$ at pin 48 to output pin 56 thereby setting output voltage $V_{OUTN}$ and the voltage at input 50B of driver 50 to be substantially equal to reference voltage $V_{REF}$; opening switch 20 disconnects input pin 42 from the terminal of capacitor 38 connected to input pin 44; opening switch 22 disconnects reference voltage $V_{REF}$ at input pin 48 from output pin 54 and from input 50A of driver 50; and opening switch 24 disconnects voltage $V_{REF}$ at input pin 48 from input pin 46 and terminal 30C of switch 30. It should be noted that one terminal of capacitor 60 is connected to output pin 56 and the other terminal of capacitor 60 is connected to output pin 54 and that the voltage across capacitor 60 is the voltage from output pin 54 to output pin 56.

In this configuration, the voltage $V_{OUTP}$ at output pin 54 is equal to the voltage at input pin 46, i.e., voltage $V_{IN}$, plus the voltage across capacitor 38, which can range from 0 volts to a voltage equal to the difference between voltage $V_{IN}$ and reference voltage $V_{REF}$, i.e., $V_{IN}-V_{REF}$. Thus, the voltage at output pin 54 can range from voltage $V_{IN}$ to a voltage equal to 2 times voltage $V_{IN}$ minus reference $V_{REF}$, i.e., a voltage equal to $+2*V_{IN}-V_{REF}$. Accordingly, the voltage across capacitor 60 can range from zero to a voltage equal to $+2*(V_{IN}-V_{REF})$. In accordance with embodiments in which reference voltage $V_{REF}$ is ground, the voltage across capacitor 60 can range from ground to $+2*V_{IN}$. In accordance with embodiments in which reference voltage $V_{REF}$ is ground, FIG. 2 illustrates that between times $t_0$ and $t_1$ the voltage $V_{OUTP}$ at output pin 54 can be substantially equal to $+2*V_{IN}$ and FIG. 3 illustrates that between times $t_0$ and $t_1$ voltage $V_{OUTN}$ at output pin 56 can be substantially equal to ground.

Between times $t_3$ and $t_4$ clock signal Φ1 is at a logic high voltage level and clock signal Φ2 is at a logic low voltage level. Switches 20, 22, and 24 are closed in response to clock signal Φ1 being at a logic high voltage level and switches 30, 32, and 34 are open in response to clock signal Φ2 being at a logic low voltage level. Closing switch 20 connects voltage $V_{IN}$ at input pin 42 to the terminal of capacitor 38 connected to input pin 44; closing switch 22 connects reference voltage $V_{REF}$ at pin 48 to output pin 54 thereby setting output voltage $V_{OUTP}$ to be substantially equal to reference voltage $V_{REF}$; and closing switch 24 connects reference voltage $V_{REF}$ at input pin 48 to the terminal of capacitor 38 that is connected to input pin 46 and to terminal 30C of switch 30; opening switch 30 disconnects voltage $V_{IN}$ at input pin 42 from the terminal of capacitor 38 that is connected to input pin 46; opening switch 32 disconnects the voltage $V_{OUTP}$ at output pin 54 from the terminal of capacitor 38 that is connected to input pin 44; and opening switch 34 disconnects reference voltage $V_{REF}$ at input pin 48 from the voltage $V_{OUTN}$ at output pin 56 and from input 50B of driver 50. It should be noted that one terminal of capacitor 60 is connected to output pin 56 and the other terminal of capacitor 60 is connected to output pin 54 and that the voltage across capacitor 60 is the voltage from output pin 54 to output pin 56.

In this configuration, voltage $V_{OUTN}$ at output pin 56 is equal to the voltage at input pin 48, i.e., reference voltage $V_{REF}$, minus the voltage across capacitor 60, which can range from 0 volts to a voltage equal to $2*(V_{IN}-V_{REF})$. Thus, the voltage at output pin 56 can range from voltage $V_{REF}$ to a voltage equal to $-2*(V_{IN}-V_{REF})+V_{REF}$. Accordingly, the voltage across capacitor 60 can range from substantially 0 volts to a voltage equal to $-2*(V_{IN}-V_{REF})$. In accordance with embodiments in which voltage $V_{REF}$ is ground, the voltage on pin 56 can range from ground to $-2*V_{IN}$. In accordance with embodiments in which reference voltage $V_{REF}$ is ground, FIG. 2 illustrates that between times $t_1$ and $t_2$ the voltage $V_{OUTP}$ at output pin 54 can range from ground or ground potential to $+2*V_{IN}$ and FIG. 3 illustrates that voltage $V_{OUTN}$ at output pin 56 can range from ground or ground potential to $-2*V_{IN}$. When $V_{REF}$ is not ground, between times $t_1$ and $t_2$ voltage $V_{amp}$ at output pin 54 can range from reference voltage $V_{REF}$ to a voltage substantially equal to $+2*V_{IN}-V_{REF}$ and the voltage $V_{OUTN}$ at output pin 56 can range from voltage $V_{REF}$ to a voltage substantially equal to $-2*(V_{IN}-V_{REF})+V_{REF}$.

Figure 4:
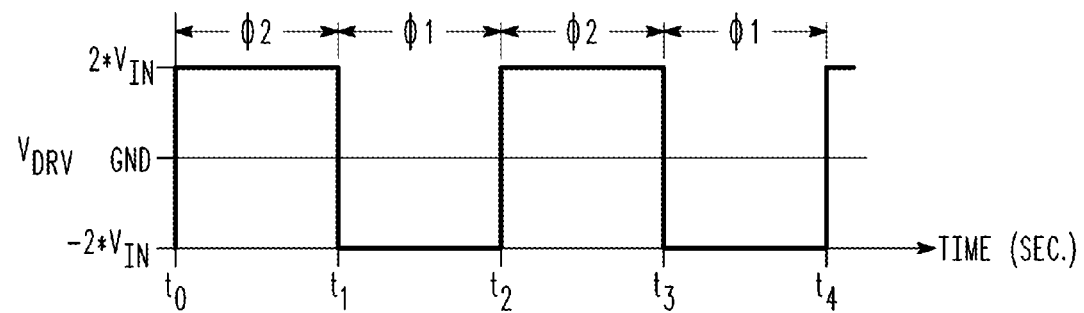
FIG. 4 is a timing diagram illustrating an output voltage of the drive circuit of FIG. 1 in accordance with another embodiment of the present invention.

FIG. 4 is a timing diagram 73 that illustrates a voltage $V_{DRV}$ on output pin 58 in response to clock signals Φ1 and Φ2 switching between logic high and logic low voltage levels in accordance with an "inverter" embodiment of the present invention. Between times $t_0$ and $t_1$ clock signal $\Phi 1$ is at a logic low voltage level and clock signal $\Phi 2$ is at a logic high voltage level. Switches 20, 22, and 24 are open in response to clock signal $\Phi 1$ being at a logic low voltage level and switches 30, 32, and 34 are closed in response to clock signal $\Phi 2$ being at a logic high voltage level. Closing switch 30 connects voltage $V_{IN}$ at input pin 42 to the terminal of capacitor 38 that is connected to input pin 46; closing switch 32 connects the terminal of capacitor 38 connected to input pin 44 to terminal 50A of driver 50; closing switch 34 connects reference voltage $V_{REF}$ at pin 48 to input 50B of driver 50; opening switch 20 disconnects input pin 42 from the terminal of capacitor 38 that is connected to input pin 44; opening switch 22 disconnects reference voltage $V_{REF}$ at input pin 48 from input 50A of driver 50; and opening switch 24 disconnects voltage $V_{REF}$ at input pin 48 from input pin 46 and terminal 30C of switch 30. It should be noted that one terminal of capacitor 60 is connected to output pin 56 and thus to input 50B of driver 50 and the other terminal of capacitor 60 is connected to output pin 54 and thus to input 50A of driver 50 and that the voltage at output 50C of driver 50 and thus voltage $V_{DRV}$ at output pin 58 is set in accordance with the voltages at inputs 50A and 50B of driver 50. In this configuration, the voltage at input 50A of driver 50 is the voltage at input pin 46, i.e., voltage $V_{IN}$, plus the voltage across capacitor 38, which voltage is substantially equal to a difference between input voltage $V_{IN}$ and reference voltage $V_{REF}$, i.e., $V_{IN}-V_{REF}$. Thus, the voltage at input 50A of driver 50 substantially equals a voltage equal to $+2*V_{IN}-V_{REF}$. Accordingly, when driver 50 drives a logic high during clock signal $\Phi 2$, the voltage at output 50C of driver 50 and thus voltage $V_{DRV}$ at output pin 58 is a voltage substantially equal to $+2*V_{IN}-V_{REF}$. In accordance with embodiments in which reference voltage $V_{REF}$ is ground, FIG. 4 illustrates that when driver 50 is in a high state during clock signal $\Phi 2$, the voltage at output 50C of driver 50 and thus voltage $V_{DRV}$ at output pin 58 substantially equals $+2*V_{IN}$.

Between times $t_1$ and $t_2$ clock signal $\Phi 1$ is at a logic high voltage level and clock signal $\Phi 2$ is at a logic low voltage level. Switches 20, 22, and 24 are closed in response to clock signal $\Phi 1$ being at a logic high voltage level and switches 30, 32, and 34 are open in response to clock signal $\Phi 2$ being at a logic low voltage level. Closing switch 20 connects voltage $V_{IN}$ at input pin 42 to the terminal of capacitor 38 that is connected to input pin 44; closing switch 22 connects reference voltage $V_{REF}$ at pin 48 to output pin 54 and to input 50A of driver 50 thereby setting the voltage at input 50A of driver 50 to be substantially equal to reference voltage $V_{REF}$; and closing switch 24 connects voltage $V_{REF}$ at input pin 48 to the terminal of capacitor 38 that is connected to input pin 46 and to terminal 30C of switch 30; opening switch 30 disconnects voltage $V_{IN}$ at input pin 42 from the terminal of capacitor 38 that is connected to input pin 46; opening switch 32 disconnects the voltage at input 50A of driver 50 from the terminal of capacitor 38 that is connected to input pin 44; and opening switch 34 disconnects reference voltage $V_{REF}$ at input pin 48 from input 50B of driver 50. In this configuration, the voltage $V_{OUTN}$ at input 50B of driver 50 equals the voltage at input pin 48, i.e., voltage $V_{REF}$, minus the voltage across capacitor 60, which is a voltage substantially equal to $2*(V_{IN}-V_{REF})$. Thus, the voltage at input 50B of driver 50 substantially equals $-2*(V_{IN}-V_{REF})+V_{REF}$. Accordingly, when driver 50 drives a logic low during clock signal $\Phi 1$, the voltage at output 50C of driver 50 and thus voltage $V_{DRV}$ at output pin 58 is substantially equal to voltage $-2*(V_{IN}-V_{REF})+V_{REF}$. In accordance with embodiments in which voltage $V_{REF}$ is ground, FIG. 4 illustrates that when driver 50 is in a low state between times $t_1$ and $t_2$, the voltage at output 50C of driver 50 and thus voltage $V_{DRV}$ at output pin 58 substantially equals $-2*V_{IN}$.

Between times $t_2$ and $t_3$ clock signal $\Phi 1$ is at a logic low voltage level and clock signal $\Phi 2$ is at a logic high voltage level. Switches 20, 22, and 24 are open in response to clock signal $\Phi 1$ being at a logic low voltage level and switches 30, 32, and 34 are closed in response to clock signal $\Phi 2$ being at a logic high voltage level. Closing switch 30 connects voltage $V_{IN}$ at input pin 42 to the terminal of capacitor 38 connected to input pin 46; closing switch 32 connects the terminal of capacitor 38 connected to input pin 44 to terminal 50A of driver 50; closing switch 34 connects reference voltage $V_{REF}$ at pin 48 to input 50B of driver 50; opening switch 20 disconnects input pin 42 from the terminal of capacitor 38 that is connected to input pin 44; opening switch 22 disconnects reference voltage $V_{REF}$ at input pin 48 from input 50A of driver 50; and opening switch 24 disconnects reference voltage $V_{REF}$ at input pin 48 from input pin 46 and terminal 30C of switch 30. It should be noted that one terminal of capacitor 60 is connected to output pin 56 and thus to input 50B of driver 50 and the other terminal of capacitor 60 is connected to output pin 54 and thus to input 50A of driver 50 and that the voltage at output 50C of driver 50 and thus voltage $V_{DRV}$ at output pin 58 is set in accordance with the voltages at inputs 50A and 50B of driver 50. In this configuration, the voltage at input 50A of driver 50 equals the voltage at input pin 46, i.e., voltage $V_{IN}$, plus the voltage across capacitor 38, which is substantially equal to a difference in voltages $V_{IN}$ and $V_{REF}$, i.e., $V_{IN}-V_{REF}$. Thus, the voltage at input 50A of driver 50 substantially equals $+2*V_{IN}-V_{REF}$. Accordingly, when driver 50 drives a logic high signal during clock signal $\Phi 2$, the voltage at output 50C of driver 50 and thus voltage $V_{DRV}$ at output pin 58 is a voltage substantially equal to $+2*V_{IN}-V_{REF}$. In accordance with embodiments in which reference voltage $V_{REF}$ is ground, FIG. 4 illustrates that when driver 50 is in a high state during clock signal $\Phi 2$, the voltage at output 50C of driver 50 and thus voltage $V_{DRV}$ at output pin 58 substantially equals $+2*V_{IN}$.

Between times $t_3$ and $t_4$ clock signal $\Phi 1$ is at a logic high voltage level and clock signal $\Phi 2$ is at a logic low voltage level. Switches 20, 22, and 24 are closed in response to clock signal $\Phi 1$ being at a logic high voltage level and switches 30, 32, and 34 are open in response to clock signal $\Phi 2$ being at a logic low voltage level. Closing switch 20 connects voltage $V_{IN}$ at input pin 42 to the terminal of capacitor 38 that is connected to input pin 44; closing switch 22 connects reference voltage $V_{REF}$ at pin 48 to output pin 54 and to input 50A of driver 50 thereby setting the voltage at input 50A of driver 50 to be substantially equal to reference voltage $V_{REF}$; and closing switch 24 connects voltage $V_{REF}$ at input pin 48 to the terminal of capacitor 38 that is connected to input pin 46 and to terminal 30C of switch 30; opening switch 30 disconnects voltage $V_{IN}$ at input pin 42 from the terminal of capacitor 38 connected to input pin 46; opening switch 32 disconnects the voltage at input 50A of driver 50 from the terminal of capacitor 38 that is connected to input pin 44; and opening switch 34 disconnects reference voltage $V_{REF}$ at input pin 48 from input 50B of driver 50. In this configuration, voltage $V_{OUTN}$ at input 50B of driver 50 equals the voltage at input pin 48, i.e., voltage $V_{REF}$, minus the voltage across capacitor 60, which is a voltage substantially equal to $2*(V_{IN}-V_{REF})$. Thus, the voltage at input 50B of driver 50 substantially equals $-2*(V_{IN}-V_{REF})+V_{REF}$. Accordingly, when driver 50 drives a logic low signal during clock signal $\Phi1$, the voltage at output 50C of driver 50 and thus voltage $V_{DRV}$ at output pin 58 substantially equals $-2*(V_{IN}-V_{REF})+V_{REF}$. In accordance with embodiments in which reference voltage $V_{REF}$ is ground, FIG. 4 illustrates that when driver 50 is in a low state between times $t_1$ and $t_2$, the voltage at output 50C of driver 50 and thus voltage $V_{DRV}$ at output pin 58 substantially equals $-2*V_{IN}$.

Figure 5:
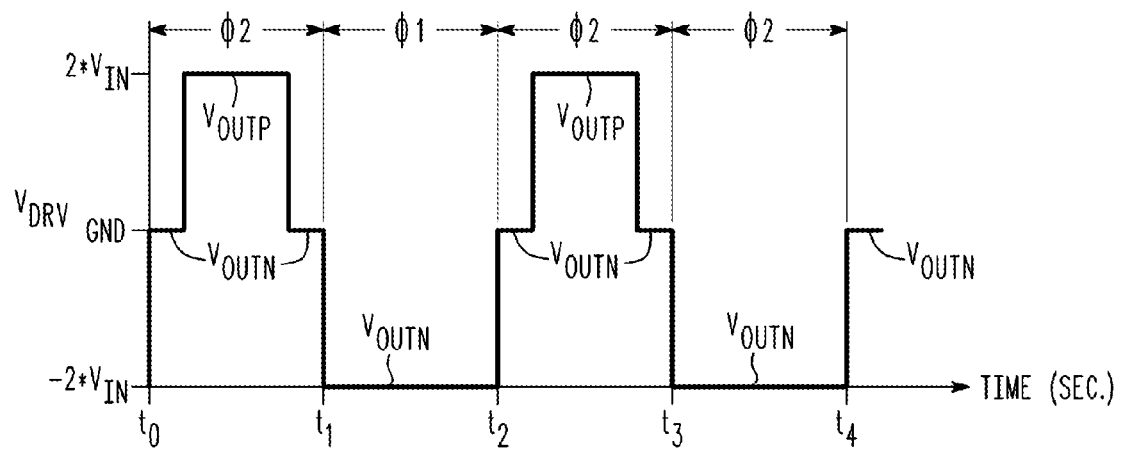
FIG. 5 is a timing diagram illustrating an output voltage of the drive circuit of FIG. 1 in accordance with another embodiment of the present invention.

FIG. 5 is a timing diagram 74 that illustrates a voltage $V_{DRV}$ on output pin 58 in response to clock signals $\Phi1$ and $\Phi2$ switching between logic high and logic low voltage levels in accordance with another embodiment of the present invention. The output voltage appearing at output 50C of driver 50, i.e., output voltage $V_{DRV}$ appearing at output pin 58, is at a low voltage level during clock signal $\Phi1$ and during about 40% of the time that clock signal $\Phi2$ is at a logic high voltage level, and is at a logic high voltage level during about 60% of the time that clock signal $\Phi2$ is at a logic low voltage level. Thus, the output voltage of driver 50 appearing at output pin 58 as output signal $V_{DRV}$ is at a voltage of $+2*V_{IN}+V_{REF}$ in response to driver 50 being in the high state during clock signal $\Phi2$, i.e., for about 60% of the duration of clock signal $\Phi2$. The signal at output 50C is at a voltage $V_{REF}$ in response to driver 52 being in the logic low state during clock signal $\Phi2$, i.e., about 40% of the duration of clock signal $\Phi2$. The signal at output 50C, i.e., output signal $V_{DRV}$ at output pin 58, is at a voltage of $-2*(V_{IN}-V_{REF})+V_{REF}$ in response to driver 50 being in the logic low state during clock signal $\Phi1$.

More particularly, between times $t_0$ and $t_1$ clock signal $\Phi1$ is at a logic low voltage level and clock signal $\Phi2$ is at a logic high voltage level. Switches 20, 22, and 24 are open in response to clock signal $\Phi1$ being at a logic low voltage level and switches 30, 32, and 34 are closed in response to clock signal $\Phi2$ being at a logic high voltage level. Closing switch 30 connects voltage $V_{IN}$ at input pin 42 to the terminal of capacitor 38 that is connected to input pin 46; closing switch 32 connects the terminal of capacitor 38 that is connected to input pin 44 to terminal 50A of driver 50; closing switch 34 connects reference voltage $V_{REF}$ at pin 48 to input 50B of driver 50; opening switch 20 disconnects input pin 42 from the terminal of capacitor 38 connected to input pin 44; opening switch 22 disconnects reference voltage $V_{REF}$ at input pin 48 from input 50A of driver 50; and opening switch 24 disconnects voltage $V_{REF}$ at input pin 48 from input pin 46 and terminal 30C of switch 30. It should be noted that one terminal of capacitor 60 is connected to output pin 56 and thus to input 50B of driver 50 and the other terminal of capacitor 60 is connected to output pin 54 and thus to input 50A of driver 50 and that the voltage at output 50C of driver 50 and thus voltage $V_{DRV}$ at output pin 58 is set in accordance with the voltages at inputs 50A and 50B of driver 50. In this configuration, the voltage at input 50A of driver 50 equals the voltage at input pin 46, i.e., voltage $V_{IN}$, plus the voltage across capacitor 38, which is substantially equal to voltage $V_{IN}-V_{REF}$. Thus, the voltage at input 50A of driver 50 substantially equals $+2*V_{IN}-V_{REF}$. Accordingly, when driver 50 is in a high state, the voltage at output 50C of driver 50, and thus voltage $V_{DRV}$ at output pin 58, is substantially equal to $+2*V_{IN}-V_{REF}$.

Between times $t_1$ and $t_2$ clock signal $\Phi1$ is at a logic high voltage level and clock signal $\Phi2$ is at a logic low voltage level. Switches 20, 22, and 24 are closed in response to clock signal $\Phi1$ being at a logic high voltage level and switches 30, 32, and 34 are open in response to clock signal $\Phi2$ being at a logic low voltage level. Closing switch 20 connects voltage $V_{IN}$ at input pin 42 to the terminal of capacitor 38 that is connected to input pin 44; closing switch 22 connects reference voltage $V_{REF}$ at pin 48 to output pin 54 and to input 50A of driver 50 thereby setting the voltage at input 50A of driver 50 to be substantially equal to reference voltage $V_{REF}$; and closing switch 24 connects voltage $V_{REF}$ at input pin 48 to the terminal of capacitor 38 that is connected to input pin 46 and to terminal 30C of switch 30; opening switch 30 disconnects voltage $V_{IN}$ at input pin 42 from the terminal of capacitor 38 that is connected to input pin 46; opening switch 32 disconnects the voltage at input 50A of driver 50 from the terminal of capacitor 38 that is connected to input pin 44; and opening switch 34 disconnects reference voltage $V_{REF}$ at input pin 48 from input 50B of driver 50. In this configuration, the voltage $V_{OUTN}$ at input 50B of driver 50 equals the voltage at input pin 48, i.e., reference voltage $V_{REF}$, minus the voltage across capacitor 60, which is substantially equal to a voltage $2*(V_{IN}-V_{REF})$. Thus, the voltage at input 50B of driver 50 substantially equals $-2*(V_{IN}-V_{REF})+V_{REF}$.

Accordingly, when driver 50 drives a logic low signal during clock signal $\Phi1$, the voltage at output 50C of driver 50 and thus voltage $V_{DRV}$ at output pin 58 substantially equals $-2*(V_{IN}-V_{REF})+V_{REF}$. In accordance with embodiments in which reference voltage $V_{REF}$ is ground, FIG. 5 illustrates that when driver 50 is in a low state between times $t_1$ and $t_2$, the voltage at output 50C of driver 50 and thus voltage $V_{DRV}$ at output pin 58 is a voltage substantially equal to $-2*V_{IN}$.

Between times $t_2$ and $t_3$ clock signal $\Phi1$ is at a logic low voltage level and clock signal $\Phi2$ is at a logic high voltage level. Switches 20, 22, and 24 are open in response to clock signal $\Phi1$ being at a logic low voltage level and switches 30, 32, and 34 are closed in response to clock signal $\Phi2$ being at a logic high voltage level. Closing switch 30 connects voltage $V_{IN}$ at input pin 42 to the terminal of capacitor 38 that is connected to input pin 46; closing switch 32 connects the terminal of capacitor 38 that is connected to input pin 44 to terminal 50A of driver 50; closing switch 34 connects reference voltage $V_{REF}$ at pin 48 to input 50B of driver 50; opening switch 20 disconnects input pin 42 from the terminal of capacitor 38 that is connected to input pin 44; opening switch 22 disconnects reference voltage $V_{REF}$ at input pin 48 from input 50A of driver 50; and opening switch 24 disconnects reference voltage $V_{REF}$ at input pin 48 from input pin 46 and terminal 30C of switch 30. It should be noted that one terminal of capacitor 60 is connected to output pin 56 and thus to input 50B of driver 50 and the other terminal of capacitor 60 is connected to output pin 54 and thus to input 50A of driver 50 and that the voltage at output 50C of driver 50 and thus voltage $V_{DRV}$ at output pin 58 is set in accordance with the voltages at inputs 50A and 50B of driver 50. In this configuration, the voltage at input 50A of driver 50 is equal to the voltage at input pin 46, i.e., voltage $V_{IN}$, plus the voltage across capacitor 38, which is a voltage substantially equal to $V_{IN}-V_{REF}$. Thus, the voltage at input 50A of driver 50 is substantially equal to $+2*V_{IN}-V_{REF}$. Accordingly, the voltage at output 50C of driver 50 and thus voltage $V_{DRV}$ at output pin 58 is substantially equal to $+2*V_{IN}-V_{REF}$ when driver 50 is in a high state, and substantially equal to reference voltage $V_{REF}$ when the driver 50 is in a low state.

Between times $t_3$ and $t_4$ clock signal $\Phi1$ is at a logic high voltage level and clock signal $\Phi2$ is at a logic low voltage level. Switches 20, 22, and 24 are closed in response to clock signal $\Phi1$ being at a logic high voltage level and switches 30, 32, and 34 are open in response to clock signal $\Phi2$ being at a logic low voltage level. Closing switch 20 connects voltage $V_{IN}$ at input pin 42 to the terminal of capacitor 38 that is connected to input pin 44; closing switch 22 connects reference voltage $V_{REF}$ at pin 48 to output pin 54 and to input 50A of driver 50 thereby setting the voltage at input 50A of driver 50 to be substantially equal to reference voltage $V_{REF}$; and closing switch 24 connects reference voltage $V_{REF}$ at input pin 48 to the terminal of capacitor 38 that is connected to input pin 46 and to terminal 30C of switch 30; opening switch 30 disconnects voltage $V_{IN}$ at input pin 42 from the terminal of capacitor 38 that is connected to input pin 46; opening switch 32 disconnects the voltage at input 50A of driver 50 from the terminal of capacitor 38 that is connected to input pin 44; and opening switch 34 disconnects reference voltage $V_{REF}$ at input pin 48 from input 50B of driver 50. In this configuration, voltage $V_{OUTN}$ at input 50B of driver 50 equals the voltage at input pin 48, i.e., reference voltage $V_{REF}$, minus the voltage across capacitor 60, which is substantially equal to voltage $2*(V_{IN}-V_{REF})$. Thus, the voltage at input 50B of driver 50 is a voltage substantially equal to $-2*(V_{IN}-V_{REF})+V_{REF}$. Accordingly, when driver 50 drives a logic low signal during clock signal Φ1, the voltage at output 50C of driver 50 and thus voltage $V_{DRV}$ at output pin 58 substantially equals $-2*(V_{IN}-V_{REF})+V_{REF}$. In accordance with embodiments in which reference voltage $V_{REF}$ is ground, FIG. 5 illustrates that when driver 50 is in a low state between times $t_1$ and $t_2$, the voltage at output 50C of driver 50 and thus voltage $V_{DRV}$ at output pin 58 substantially equals $-2*V_{IN}$.

Figure 6:
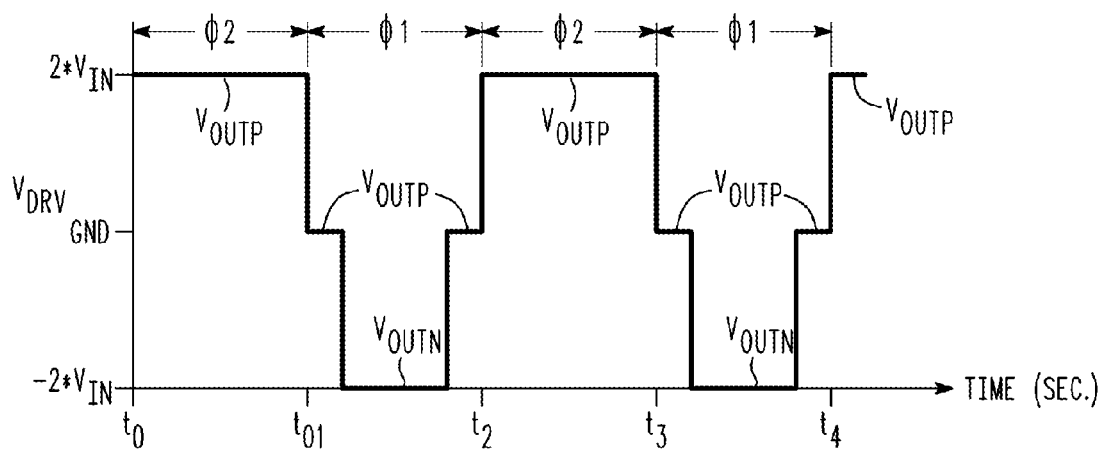
FIG. 6 is a timing diagram illustrating an output voltage of the drive circuit of FIG. 1 in accordance with another embodiment of the present invention.

FIG. 6 is a timing diagram 75 that illustrates a voltage $V_{DRV}$ on output pin 58 in response to clock signals Φ1 and Φ2 switching between logic high and logic low voltage levels in accordance with another embodiment of the present invention. The output voltage appearing at output 50C of driver 50, i.e., output signal $V_{DRV}$ appearing at output pin 58, is at a high voltage level during clock signal Φ2 and during about 40% of the time that clock signal Φ1 is at a logic high voltage level, and is at a logic low voltage level during about 60% of the time that clock signal Φ1 is at a logic high voltage level. Thus, the output signal of driver 50 appearing at output pin 58 as output signal $V_{DRV}$ is at a voltage of $+2*V_{IN}-V_{REF}$ in response to driver 50 being in the high state during clock signal Φ2 and during about 40% clock signal Φ1. The signal at output 50C is at a voltage $V_{REF}$ in response to driver 50 being in the low state during clock signal Φ1, i.e., about 40% of the duration of clock signal Φ1. The signal at output 50C, i.e., output signal $V_{DRV}$ at output pin 58, is at a voltage of $-2*(V_{IN}-V_{REF})+V_{REF}$ in response to driver 50 being in the low state during clock signal Φ1.

Figure 7:
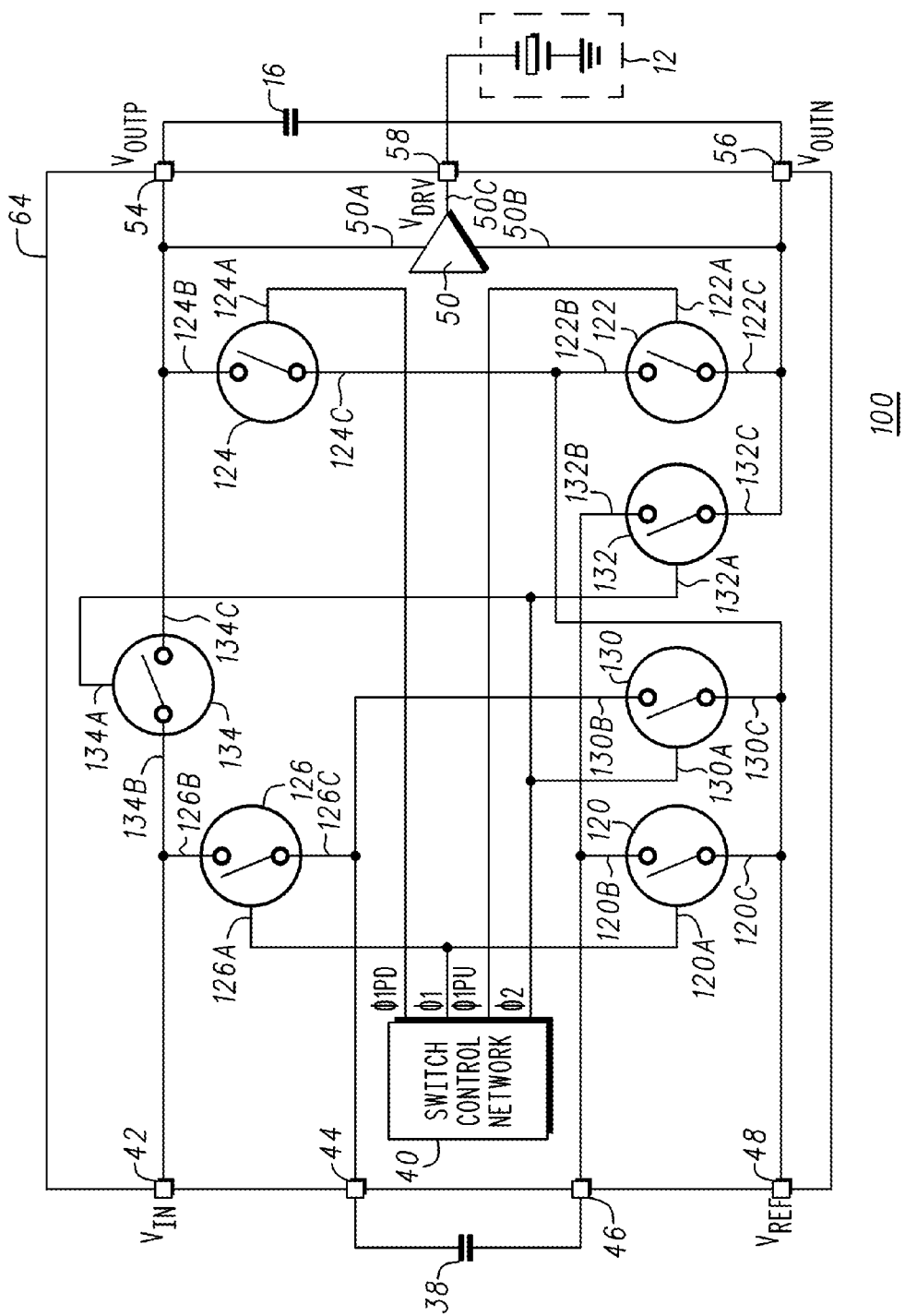
FIG. 7 is a schematic diagram of a drive circuit in accordance with another embodiment of the present invention.

FIG. 7 is a circuit schematic of a transformer-less and inductor-less drive circuit 100 suitable for driving a circuit 12 which circuit can be, for example, a transducer, a sensor, a piezoelectric device, an actuator, or a load, especially driving a circuit or a circuit element with capacitive or resistive behavior at low frequencies, or the like. It should be noted that transformer-less and inductor-less drive circuit 100 is suitable for driving control terminals of semiconductor devices (such as gates of NDMOS devices, GaN HEMT devices, etc.) to initiate a switching action in these devices. In addition, drive circuit 100 can drive a depletion mode device. What is shown in FIG. 7 is a switching network comprising switches 120 and 126 driven by a clocking signal Φ1, a switching network comprising switches 130, 132, and 134 driven by a clocking signal Φ2, a switching network 122 driven by a clock signal Φ1PU, and a switching network 124 driven by a clock signal Φ1PD. Clocking signals Φ1, Φ2, Φ1PU, and Φ1PD are generated by a switch control network 40. It should be noted that clock signals Φ1PU and Φ1PD are mutually exclusive or non-overlapping, i.e. not at a logic high at the same time, and that clock signals Φ1PU, and Φ1PD are normally not enabled when clock signal Φ2 is enabled. Thus, clock signals Φ1PU and Φ1PD are configured so that they may be at a logic high voltage level when clock signal Φ1 is at a logic high voltage level, and are at a logic low voltage level when clock signal Φ2 is at a logic high voltage level.

Each switch 120, 122, 124, 126, 130, 132, and 134 has a control terminal and a pair of current conducting terminals. Control terminals 120A and 126A of switches 120 and 126, respectively, are coupled for receiving clocking signal Φ1; control terminals 130A, 132A, and 134A of switches 130, 132, and 134, respectively, are coupled for receiving clocking signal Φ2; control terminal 124A of switch 124 is coupled for receiving clocking signal Φ1PD; and control terminal 122A of switch 122 is coupled for receiving clocking signal Φ1PU. Current conducting terminals 126B and 134B of switches 126 and 134, respectively, are connected to an input pin 42, current conducting terminals 126C and 130B of switches 126 and 130, respectively, are connected to an input pin 44; current conducting terminals 120B and 132B of switches 120 and 132, respectively, are connected to an input pin 46, and current conducting terminals 120C, 130C, 124C, and 122B of switches 120, 130, 124, and 122, respectively, are connected to an input pin 48. Input pin 42 is coupled for receiving an input voltage $V_{IN}$, input pin 48 is coupled for receiving a reference voltage $V_{REF}$, input pin 44 is coupled to one terminal of a capacitor 38 and input pin 46 is connected to the other terminal of capacitor 38.

It should be noted that the connectivity between switch control network 40 and control terminals 120A, 122A, 124A, 126A, 130A, 132A, and 134A of switches 120, 122, 124, 126, 130, 132, and 134, respectively, shown in FIG. 7 indicate that control terminals 120A, 122A, 124A, 126A, 130A, 132A, and 134A are being controlled logically by the signals Φ1, Φ1PD, Φ1PU, and Φ2 from control network 40. The connections from switch control network 40 to control terminals 120A, 122A, 124A, 126A, 130A, 132A, and 134A of switches 120, 122, 124, 126, 130, 132, and 134, respectively, are not intended to imply that all nets are connected to the same node or are electrically at the same potential. Control network 40 may communicate the logical signals to 120A, 122A, 124A, 126A, 130A, 132A, and 134A of switches 120, 122, 124, 126, 130, 132, and 134, respectively, wherein level shifters may be included to convert the drive signals to a desired level to activate and deactivate switches 120, 122, 124, 126, 130, 132, and 134, i.e., the polarity of the gate voltage for switches comprised of field effect transistors depends of the transistor type (n-channel or p-channel). Input pins 42, 44, 46, and 48 may be referred to as input terminals, input leads, or inputs.

Current conducting terminals 124B and 134C of switches 124 and 134, respectively, are connected to an output pin 54 and current conducting terminals 132C and 122C of switches 132 and 122, respectively, are connected to output pin 56. Circuit 100 further includes a driver 50 having inputs 50A and 50B and an output 50C, wherein input 50A is connected to current conducting terminals 124B and 134B and to output pin 54 and input 50B is connected to current conducting terminals 122C and 132C and to output pin 56. Output terminal 50C is connected to output pin 58 and provides a drive signal $V_{DRV}$ to circuit 12. An output signal $V_{OUTP}$ appears at output pin 54 and an output signal $V_{OUTN}$ appears at output pin 56. A capacitor 60 has a terminal connected to output pin 54 and a terminal connected to output pin 56. Output pins 54, 56, and 58 may be referred to as output terminals, output leads, or outputs.

It should be noted that transformer-less and inductor-less drive circuit 100 is shown as being monolithically integrated in a package 64 having input pins 42, 44, 46, and 48 and output pins 54, 56, and 58.

In operation, switches 120 and 126 are opened and closed in response to clocking signal Φ1, a switching network comprising switches 130, 132, and 134 are opened and closed in response to clocking signal Φ2, switch 122 is opened and closed in response to clock signal Φ1PU, and switch 124 is opened and closed in response to clock signal Φ1PD. In response to clock signal Φ1 being at a logic high voltage level, clock signal Φ2 being at a logic low voltage level, clock signal Φ1PU being at a logic high voltage level, and clock signal Φ1PD being at a logic low voltage level, input voltage $V_{IN}$ at input pin 42 is connected to input pin 44, to the terminal of capacitor 38 connected to input pin 44 and to current conducting terminal 130B of switch 130; reference voltage $V_{REF}$ at input pin 48 is connected to input pin 46 and to current conducting terminal 132B of switch 132; reference voltage $V_{REF}$ at input pin 48 is connected to output pin 56 serving as output voltage $V_{OUTN}$, which appears on the terminal of capacitor 16 that is connected to output pin 56; switch 130 is open, disconnecting input pin 44 from input pin 48; switch 132 is open, disconnecting input pin 46 from output pin 56; switch 134 is open, disconnecting input pin 42 from output pin 54; and switch 124 is open, disconnecting input pin 48 from output pin 54. Thus, capacitor 38 is charged to voltage equal to the difference between voltage $V_{IN}$ and reference voltage $V_{REF}$, i.e., $V_{IN}-V_{REF}$, and voltage $V_{OUTP}$ (and therefore input 50A of driver 50) becomes substantially equal to a voltage equal to the difference between voltage $\backslash T_{OUT}$ and $V_{REF}$, i.e., $V_{OUT}-V_{REF}$, output voltage $V_{OUT}$ being the voltage across capacitor 60. In accordance with embodiments in which voltage reference voltage $V_{REF}$ is ground, capacitor 38 is charged to voltage $V_{IN}$.

In response to clock signal Φ2 being at a logic high voltage level, and clock signals Φ1, Φ1PU, and Φ1PD being at a logic low voltage level, input voltage $V_{IN}$ at input pin 42 is disconnected from input pin 44, from the terminal of capacitor 38 connected to input pin 44 and from current conducting terminal 130B of switch 130; reference voltage $V_{REF}$ at input pin 48 is disconnected from input pin 46 and from current conducting terminal 132B of switch 132; reference voltage $V_{REF}$ at input pin 48 is disconnected from output pin 56 and from the terminal of capacitor 16 that is connected to output pin 56; switch 130 is closed, thereby connecting input pin 48 to input pin 44 and to the terminal of capacitor 38 connected to input pin 44; switch 132 is closed, thereby connecting input pin 46 and the terminal of capacitor connected to input pin 46 to output pin 56 and to the terminal of capacitor 60 connected to input terminal 56; switch 134 is closed thereby connecting input pin 42 to output pin 54, which connects input voltage $V_{IN}$ to output pin 54, to the terminal of capacitor 60 connected to input pin 54, and to input 50A of driver 50; and switch 124 is open, disconnecting input pin 48 from output pin 54. Thus, a voltage equal to $-(V_{IN}-V_{REF})+V_{REF}=-V_{IN}+2*V_{REF}$ appears at output pin 56 as output voltage $V_{OUTN}$ and at input 50B of driver 50 and the voltage $+V_{IN}$ appears at output pin 54 as output voltage $V_{OUTP}$ and at input 50A of driver 50. Thus a voltage equal to $V_{OUT}=+2*(V_{IN}-V_{REF})$ appears across capacitor 60. In accordance with embodiments in which reference voltage $V_{REF}$ is ground, a voltage of substantially $+2*V_{IN}$ appears across capacitor 60.

In response to clock signal Φ1 being at a logic high voltage level, clock signal Φ2 being at a logic low voltage level, clock signal Φ1PU being at a logic low voltage level, and clock signal Φ1PD being at a logic high voltage level, input voltage $V_{IN}$ at input pin 42 is connected to input pin 44, to the terminal of capacitor 38 connected to input pin 44 and to current conducting terminal 130B of switch 130; reference voltage $V_{REF}$ at input pin 48 is connected to input pin 46 and to current conducting terminal 132B of switch 132; reference voltage $V_{REF}$ at input pin 48 is disconnected from output pin 56; switch 130 is open, disconnecting input pin 44 from input pin 48; switch 132 is open, disconnecting input pin 46 from output pin 56; switch 134 is open, disconnecting input pin 42 from output pin 54; and switch 124 is closed, thereby connecting reference voltage $V_{REF}$ at input pin 48 to output pin 54 and to the terminal of capacitor 60 connected to output pin 54, setting output voltage $V_{OUTP}$ substantially equal to reference voltage $V_{REF}$. Output voltage $V_{OUTN}$ becomes substantially equal to a voltage that is the difference between reference voltage $V_{REF}$ and output voltage $V_{OUT}$, i.e., $V_{REF}-V_{OUT}$, which will approach a voltage substantially equal to $-2*(V_{IN}-V_{REF})+V_{REF}$. Thus, the voltage at input 50B ranges from a reference voltage $V_{REF}$ to a voltage equal to $-2*(V_{IN}-V_{REF})+V_{REF}$ and the voltage at output 50C and thus at output pin 58, i.e., output voltage $V_{DRV}$, can range from a reference voltage $V_{REF}$ to a voltage substantially equal to $-2*(V^{IN}-V_{REF})+V_{REF}$. In accordance with embodiments in which reference voltage $V_{REF}$ is ground, output voltage $V_{DRV}$ can range from ground to a voltage substantially equal to $-2*V_{IN}$.

Figure 8:
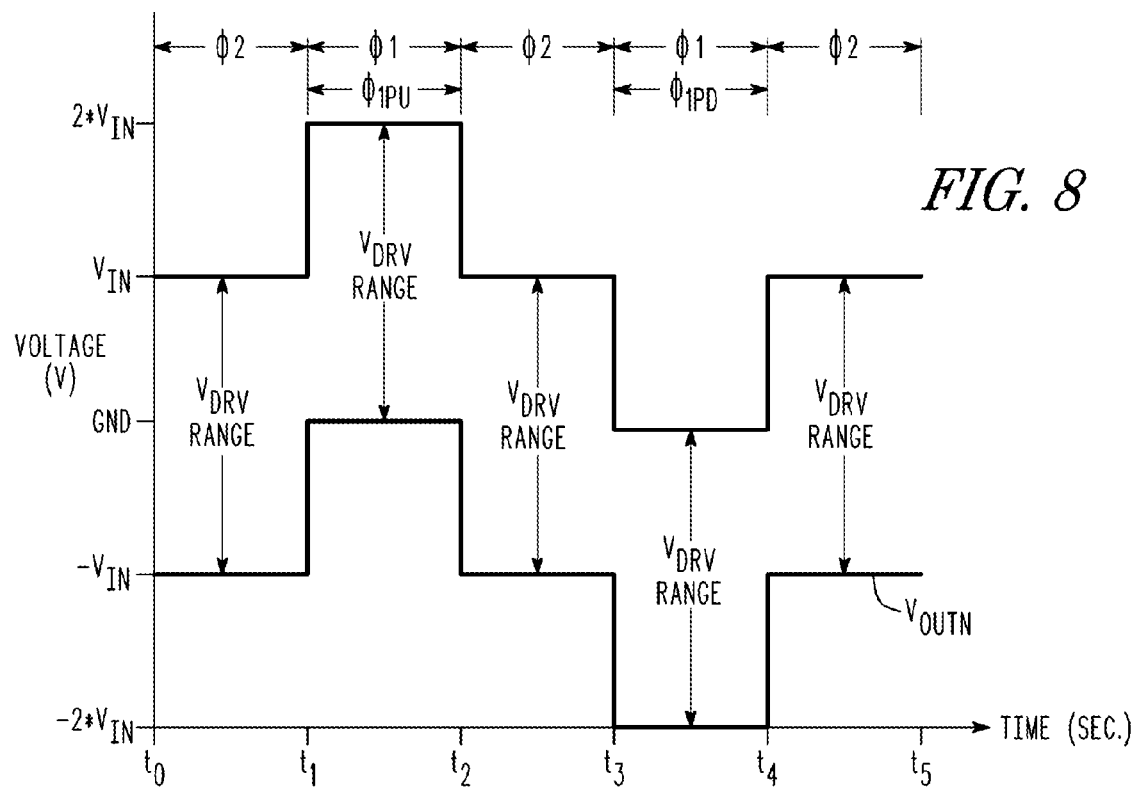
FIG. 8 is a timing diagram illustrating an output voltage of the drive circuit of FIG. 1 in accordance with another embodiment of the present invention.

FIG. 8 is a timing diagram 140 that illustrates the voltages on output pins 54 and 56 for an embodiment where reference voltage $V_{REF}$ is at ground potential, GND. Here, output pin 54, i.e., voltage $V_{OUTP}$, is at voltage level+$2*V_{IN}$ between times $t_1$ and $t_2$ (during which clock signals Φ1 and Φ1PU are at a logic high level), at voltage level+$V_{IN}$ between times $t_0$ and $t_1$, between times $t_2$ and $t_3$, and between times $t_4$ and $t_5$ (during which clock signal Φ2 is at a logic high level and clock signals Φ1, Φ1PD and Φ1PU are at logic low levels); and at ground between times $t_3$ and $t_4$ (during which clock signals Φ1 and Φ1PD are at a logic high level).

Output pin 56, i.e., output voltage $V_{OUTN}$, is at ground voltage level between times $t_1$ and $t_2$ (during which clock signals Φ1 and Φ1PU are at a logic high level), at voltage level $-V_{IN}$ between times $t_0$ and $t_1$, between times $t_2$ and $t_3$, and between times $t_4$ and $t_5$ (during which clock signal Φ2 is at a logic high level and clock signals Φ1, Φ1PD and Φ1PU are at logic low levels); and at voltage level $-2*V_{IN}$ between times $t_3$ and $t_4$ (during which clock signals Φ1 and Φ1PD are at a logic high level).

It should be further noted that the voltage range at output 58, i.e., the $V_{DRV}$ range of a driver which is powered between pin 54 and pin 56, is substantially equal to $2*V_{IN}$ between times $t_0$ and $t_1$ ($+V_{IN}--V_{IN}$), between times $t_1$ and $t_2$ ($+2*V_{IN}$–ground), between times $t_2$ and $t_3$ ($+V_{IN}--V_{IN}$), between times $t_3$ and $t_4$ (ground--$2*V_{IN}$), and between times $t_4$ and $t_5$ ($+V_{IN}--V_{IN}$).

Figure 9:
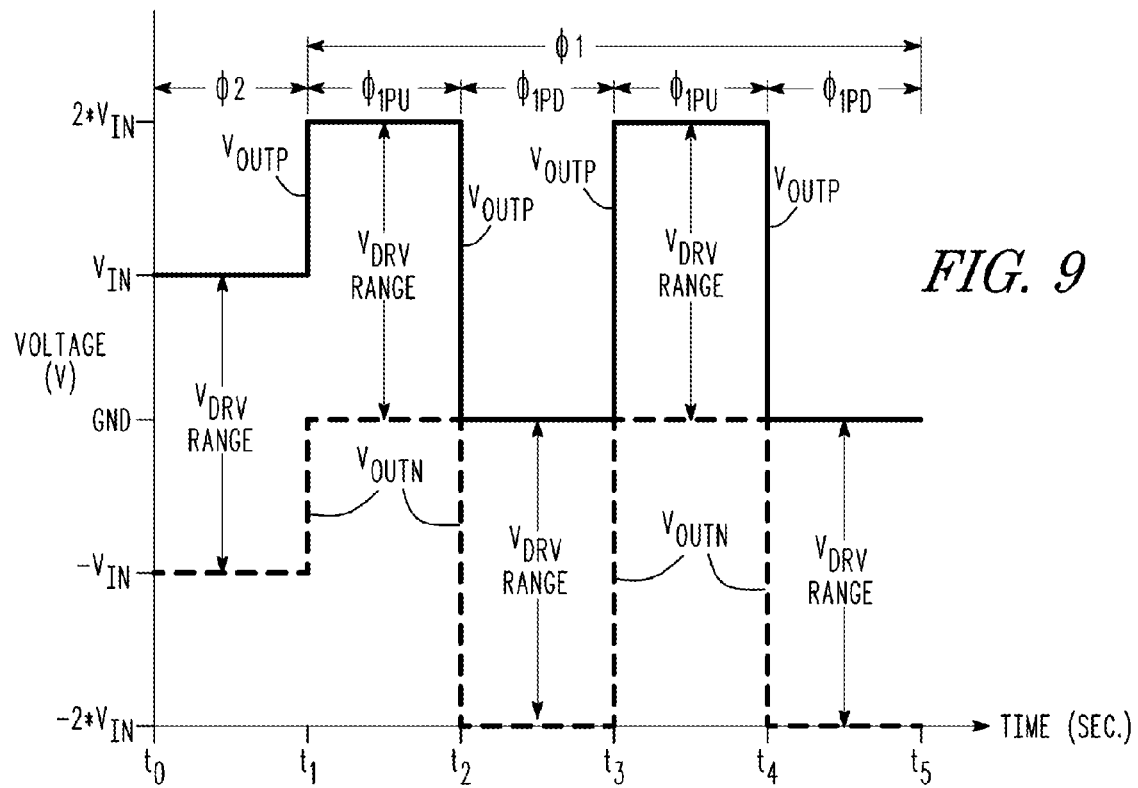
FIG. 9 is a timing diagram illustrating an output voltage of the drive circuit of FIG. 1 in accordance with another embodiment of the present invention.

FIG. 9 is a timing diagram 142 that illustrates the voltages on output pins 54 and 56 for an embodiment where reference voltage $V_{REF}$ is at ground potential, GND. Here, output pin 54, i.e., output voltage $V_{OUTP}$, is at voltage level+$2*V_{IN}$ between times $t_1$ and $t_2$ and between times $t_3$ and $t_4$ (during which clock signals Φ1 and Φ1PU are at a logic high level), at voltage level+$V_{IN}$ between times $t_0$ and $t_1$ (during which clock signal Φ2 is at a logic high level and clock signals Φ1, Φ1PD and Φ1PU are at logic low levels); and at ground between times $t_2$ and $t_3$ and between times $t_4$ and $t_5$ (during which clock signals Φ1 and Φ1PD are at a logic high level).

Output pin 56, at which voltage $V_{OUTN}$ appears, is at ground voltage level between times $t_1$ and $t_2$ and between times $t_3$ and $t_4$ (during which clock signals Φ1 and Φ1PU are at a logic high level), at voltage level $-V_{IN}$ between times $t_0$ and $t_1$ (during which clock signal Φ2 is at a logic high level and clock signals Φ1, Φ1PD and Φ1PU are at logic low levels); and at a voltage level of $-2*V_{IN}$ between times $t_2$ and $t_3$ and between times $t_4$ and $t_5$ (during which clock signals Φ1 and Φ1PD are at a logic high level).

It should be further noted that the voltage range at output 58, i.e., the $V_{DRV}$ range, is equal to $2*V_{IN}$ between times $t_0$ and $t_1$ ($+V_{IN}$--$-V_{IN}$), between times $t_1$ and $t_2$ ($+2*V_{IN}$-ground), between times $t_2$ and $t_3$ (ground potential--$-2*V_{IN}$), between times $t_3$ and $t_4$ ($2*V_{IN}$-ground potential), and between times $t_4$ and $t_5$ (ground potential--$-2*V_{IN}$).

Figure 10:
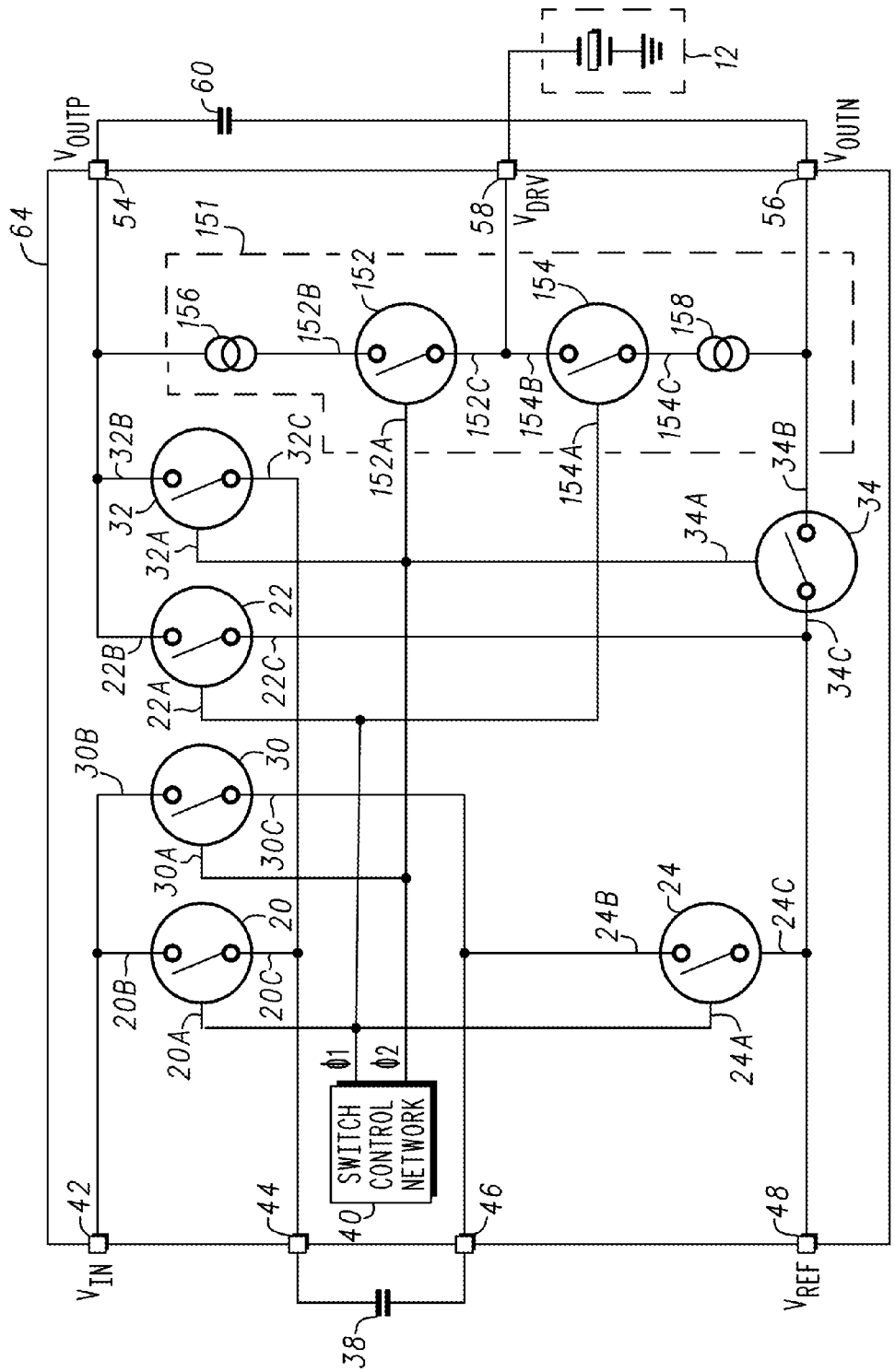
FIG. 10 is a schematic diagram of a drive circuit in accordance with another embodiment of the present invention.

FIG. 10 is a circuit schematic of a transformer-less and inductor-less drive circuit 150 suitable for driving a circuit 12 which circuit can be, for example, a transducer, a sensor, a piezoelectric device, an actuator, or a load, especially driving a circuit or a circuit element with capacitive or resistive behavior at low frequencies, or the like. It should be noted that transformer-less and inductor-less drive circuit 150 is suitable for driving control terminals of semiconductor devices (such as gates of NDMOS devices, GaN HEMT devices, etc.) to initiate a switching action in these devices. In addition, drive circuit 150 can drive a depletion mode device. What is shown in FIG. 10 is a switching network comprising switches 20, 22, and 24 driven by a clock signal Φ1 and a switching network comprising switches 30, 32, and 34 driven by a clock signal Φ2. Clock signals Φ1 and Φ2 are generated by a switch control network 40. Switches 20, 22, 24, 30, 32, and 34, as well as clocking signals Φ1 and Φ2 have been described with reference to FIG. 1.

Transformer-less and inductor-less drive circuit 150 differs from transformer-less and inductor-less drive circuit 10 in that driver 50 has been replaced by clocked driver 151, which may be comprised of switches 152 and 154 and current limiters 156 and 158. It should be noted that current limiters 156 and 158 may be real current limiting devices that are explicitly put in series with the switches or they may symbolically represent the current-limited nature of the respective switches 152 and 154, i.e., the inclusion of current limiters is optional.

Switch 152 has a control terminal 152A, a conduction terminal 154B, and a conduction terminal 152C, and switch 154 has a control terminal 154A, a conduction terminal 154B, and a conduction terminal 154C. More particularly, control terminal 152A of switch 152 is coupled for receiving clocking signal Φ2, conduction terminal 152C is connected to output pin 58, and conduction terminal 152B is connected to output pin 54 through a current limiter 156, wherein current limiter 156 has a terminal connected to conduction terminal 152B and a terminal connected to output pin 54. Control terminal 154A of switch 154 is coupled for receiving clocking signal Φ1, conduction terminal 152B is connected to output pin 58, and conduction terminal 154C is connected to output pin 56 through a current limiter 158, wherein current limiter 158 has a terminal connected to conduction terminal 154C and a terminal connected to output pin 56.

It should be noted that the connectivity between switch control network 40 and control terminals 20A, 22A, 24A, 30A, 32A, 34A, 152A, and 154A of switches 20, 22, 24, 30, 32, 34, 152, and 154, respectively, shown in FIG. 1 indicate that control terminals 20A, 22A, 24A, 30A, 32A, 34A, 152A, and 154A are being controlled logically by the signals Φ1 and Φ2 from control network 40. The connections from switch control network 40 to control terminals 20A, 22A, 24A, 30A, 32A, 34A, 152A, and 154A of switches 20, 22, 24, 30, 32, 34, 152, and 154, respectively, are not intended to imply that all nets are connected to the same node or are electrically at the same potential. Control network 40 may communicate the logical signals to 20A, 22A, 24A, 30A, 32A, 34A, 152A, and 154A of switches 20, 22, 24, 30, 32, 34, 152, and 154, respectively, wherein level shifters may be included to convert the drive signals to a desired level to activate and deactivate switches 20, 22, 24, 30, 32, 34, 152, and 154, i.e., the polarity of the gate voltage for switches comprised of field effect transistors depends of the transistor type (n-channel or p-channel).

Figure 11:
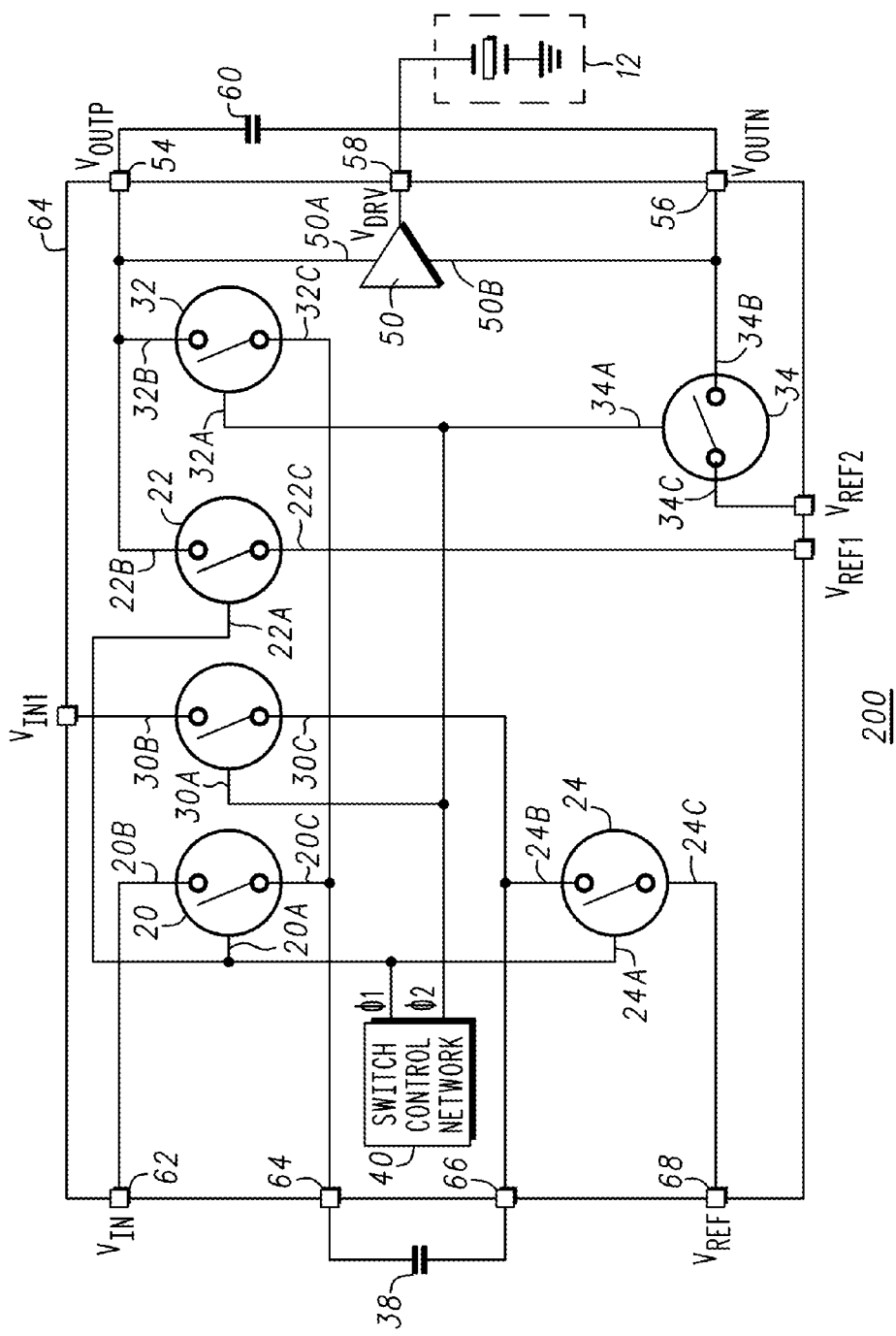
FIG. 11 is a schematic diagram of a drive circuit in accordance with another embodiment of the present invention.

FIG. 11 is a circuit schematic of a transformer-less and inductor-less drive circuit 200 suitable for driving a circuit 12 which circuit can be, for example, a transducer, a sensor, a piezoelectric device, an actuator, or a load, especially driving a circuit or a circuit element with capacitive or resistive behavior at low frequencies, or the like. It should be noted that transformer-less and inductor-less drive circuit 200 is suitable for driving control terminals of semiconductor devices (such as gates of NDMOS devices, GaN HEMT devices, etc.) to initiate a switching action in these devices. In addition, drive circuit 200 can drive a depletion mode device. What is shown in FIG. 11 is a switching network comprising switches 20, 22, and 24 driven by a clocking signal Φ1 and a switching network comprising switches 30, 32, and 34 driven by a clocking signal Φ2. Clocking signals Φ1 and Φ2 are generated by a switch control network 40. Switches 20, 22, 24, 30, 32, and 34, as well as clocking signals Φ1 and Φ2 have been described with reference to FIG. 1. Transformer-less and inductor-less drive circuit 200 differs from transformer-less and inductor-less drive circuit 10 in that current conducting terminal 30B is connected to input signal $V_{IN}$ rather than to input pin 42, current conducting terminal 22C is coupled for receiving a potential such as, for example, a reference voltage $V_{REF}$, rather than being connected to input pin 48, which is coupled for receiving reference voltage $V_{REF}$, and current conducting terminal 34C is coupled for receiving a potential such as, for example, voltage $V_{REF2}$, rather than being connected to input pin 48.

As discussed with reference to FIG. 1, the connectivity between switch control network 40 and control terminals 20A, 22A, 24A, 30A, 32A, and 34A of switches 20, 22, 24, 30, 32, and 34, respectively, shown in FIG. 1 indicate that control terminals 20A, 22A, 24A, 30A, 32A, and 34A are being controlled logically by the signals Φ1 and Φ2 from control network 40. The connections from switch control network 40 to control terminals 20A, 22A, 24A, 30A, 32A, and 34A of switches 20, 22, 24, 30, 32, and 34, respectively, are not intended to imply that all nets are connected to the same node or are electrically at the same potential. Control network 40 may communicate the logical signals to 20A, 22A, 24A, 30A, 32A, and 34A of switches 20, 22, 24, 30, 32, and 34, respectively, wherein level shifters may be included to convert the drive signals to a desired level to activate and deactivate switches 20, 22, 24, 30, 32, and 34, i.e., the polarity of the gate voltage for switches comprised of field effect transistors depends of the transistor type (n-channel or p-channel).

It should be noted that in the embodiment of FIG. 1, voltages $V_{IN}$ and $V_{REF}$ serve as reference potentials from which other potentials are derived. For example, voltage $V_{IN}$ may serve as the supply voltage $V_{SUP}$ of the switch structure of FIG. 1 and that not all switches connecting to this supply connect to the same supply voltage. In addition, reference voltage $V_{REF}$ may serve as a ground potential for the switch structures in FIG. 1; however not all switches that connect to this ground are connected to the same ground. Thus, the embodiment of FIG. 10 offers degrees of freedom, i.e., using different grounds allows for the generation of drive signals $V_{DRV}$ with a non-DC voltage.

By now it should be appreciated that a low-cost transformer-less and inductor-less drive circuit and a method for generating a drive signal have been provided. The peak-to-peak drive voltage can be up to $4*V_{IN}$, i.e., a $+2*V_{IN}$ drive and a $-2*V_{IN}$ drive as opposed to a $2*V_{IN}$ drive limitation of other two capacitor configurations. In addition, this embodiment is able to maintain a DC voltage of zero volts over the transducer, or, to intentionally generate a non-zero DC voltage over the transducer drive range (e.g., by means of the duty cycle of the waveform or by means of the selection of the $V_{IN}$ and $V_{REF}$ voltages).

In ultrasonic park assist applications, a higher transmit power is achieved with increases the range distance and improves drawbacks encountered in the distance versus battery voltage life. Thus when a battery voltage $V_{BAT}$, i.e., $V_{IN}$ is low, e.g., when a starter motor in an automobile is operating or when the start-stop system is suddenly engaged so as may occur during a traffic jam, use of driver circuit 10 improves safety. In addition, the output voltage of driver circuit 10 can be controlled independently of input voltage $V_{IN}$.

Transformer-less and inductor-less drive circuit 10 also allows grounding of one terminal of the piezo devices and can be used in applications in which a single terminal is available, where one terminal is always grounded, where one terminal is grounded or connected to a reference plane, or where one terminal cannot be driven. It is also suitable for uses that encounter high energy electrostatic discharge (ESD) pulses since the grounding of one terminal allows better shielding against ESD. Moreover, unlike single-ended charge pump based applications, drive circuit 10 can have a peak-to-peak voltage range of 4 times the input voltage, i.e. $+2*V_{IN}$ to $-2*V_{IN}$. In addition, drive circuit 10 is suitable for delivering a peak-to-peak voltage swing of $4*V_{IN}$ over a load at zero DC input voltage for a variety of applications, including 2-capacitor charge pump configurations.

In accordance with an embodiment, a doubler is provided that is capable of creating a voltage of $2*V_{IN}$ over voltage $V_{OUT}$ across capacitor 60, i.e., voltage $V_{OUT}$ may be approximated as a voltage given by $V_{OUTP}-V_{OUTN}$, which is approximately equal to $2*V_{IN}$. This may be accomplished using switches, for example, switches 20, 24, 30, 32, and 34 of transformer-less and inductor-less drive circuit 10 shown in FIG. 1. In addition, switches 22 and 34 may be used to alternately connect the terminals of capacitor 60 that are connected to output pins 54 and 56, i.e., output nodes $V_{OUTP}$ and $V_{OUTN}$, respectively, to ground. This creates a voltage of $2*V_{IN}$ at output pin 54 and a voltage of $-2*V_{IN}$ at output pin 56. Thus, when alternately driving output pin 58 to output pin 54 (when output pin 54 has a voltage of $2*V_{IN}$) and to output pin 56 (when 56 has a voltage of $-2*V_{IN}$), transformer-less and inductor-less drive circuit 10 shown in FIG. 1 may be referred to as a $4*V_{SUP}$ driver.

Although the transformer-less drive circuits have been described using switches, it should be noted that this is not a limitation. For example, some of the switches may be replaced by diodes or unidirectional components without detracting from the functionality of the transformer-less and inductor-less drive circuits. Preferably, the unidirectional components are placed in such a way that they either conduct or block current automatically, i.e., without a clock, in response to the voltage on their terminals in a fashion similar to the way switches respond to clock signals. It should be noted that making this change may change the magnitude of the output signal due to voltage losses over the diode or unidirectional components.

Although specific embodiments have been disclosed herein, it is not intended that the invention be limited to the disclosed embodiments. Those skilled in the art will recognize that modifications and variations can be made without departing from the spirit of the invention. For example, capacitor 38 can be replaced by an inductor and the switch circuitry can be modified to be compatible with an inductor. It is intended that the invention encompass all such modifications and variations as fall within the scope of the appended claims.

What is claimed is:
1. A transformer-less drive circuit, comprising:
a switch control network having a first output terminal and a second output terminal;
a first switch having a control terminal, a first conduction terminal, and a second conduction terminal, the control terminal of the first switch coupled for receiving a first clock signal from the switch control network;
a second switch having a control terminal, a first conduction terminal, and a second conduction terminal, the control terminal of the second switch coupled for receiving a second clock signal from the switch control network;
a driver having a first input, a second input, and an output, the first input of the driver coupled to the first current conduction terminal of the second switch; and
a third switch having a control terminal, a first conduction terminal, and a second conduction terminal, the control terminal of the third switch coupled for receiving the second clock signal from the switch control network, the first conduction terminal of the third switch coupled to the second input terminal of the driver, and the second conduction terminal of the third switch coupled to the second conduction terminal of the first switch.

2. The transformer-less drive circuit of claim 1, further including a fourth switch having a control terminal, a first conduction terminal and a second conduction terminal, the control terminal of the fourth switch coupled for receiving the first clock signal from the switch control network, the first conduction terminal of the fourth switch coupled for receiving an input voltage, and the second conduction terminal of the fourth switch coupled to the second conduction terminal of the second switch.

3. The transformer-less drive circuit of claim 2, further including a fifth switch having a control terminal, a first conduction terminal and a second conduction terminal, the control terminal of the fifth switch coupled for receiving the second clock signal from the switch control network, the first conduction terminal of the fifth switch coupled for receiving an input voltage, and the second conduction terminal of the fifth switch coupled to the first conduction terminal of the first switch.

4. The transformer-less drive circuit of claim 3, further including a sixth switch having a control terminal, a first conduction terminal and a second conduction terminal, the control terminal of the sixth switch coupled for receiving the first clock signal from the switch control network, the first conduction terminal of the sixth switch coupled to the first input of the driver, and the second conduction terminal of the sixth switch coupled to the second conduction terminal of the first switch.

5. The transformer-less drive circuit of claim 1, further including:
a fourth switch having a control terminal, a first conduction terminal and a second conduction terminal, the control terminal of the fourth switch coupled for receiving the first clock signal from the switch control network, the first conduction terminal of the fourth switch coupled for receiving an input voltage, and the second conduction terminal of the fourth switch coupled to the second conduction terminal of the second switch;
a fifth switch having a control terminal, a first conduction terminal and a second conduction terminal, the control terminal of the fifth switch coupled for receiving the second clock signal from the switch control network, the first conduction terminal of the fifth switch coupled for receiving an input voltage, and the second conduction terminal of the fifth switch coupled to the first conduction terminal of the first switch;
a sixth switch having a control terminal, a first conduction terminal and a second conduction terminal, the control terminal of the sixth switch coupled for receiving the first clock signal from the switch control network, the first conduction terminal of the sixth switch coupled to the driver, and the second conduction terminal of the sixth switch coupled to the second conduction terminal of the first switch; and wherein the driver is a clocked driver comprising:
a first driver switch having a control terminal, a first conduction terminal, and a second conduction terminal, the control terminal of the first driver switch coupled for receiving the second clock signal from the switch control network and serving as a first clock input terminal;
a second driver switch having a control terminal, a first conduction terminal, and a second conduction terminal, the control terminal of the first driver switch coupled for receiving the first clock signal from the switch control network and serving as a second clock input terminal, and the first conduction terminal of the second driver switch coupled to the second conduction terminal of the first driver switch;
a first current limiter having a first terminal and a second terminal, the first terminal of the first current limiter coupled to the first conduction terminal of the second switch and the second terminal of the first current limiter coupled to the first conduction terminal of the first driver switch; and
a second current limiter having a first terminal and a second terminal, the first terminal of the second current limiter coupled to the first conduction terminal of the third switch and the second terminal of the second current limiter coupled to the second conduction terminal of the second driver switch.

6. A transformer-less drive circuit, comprising:
a switch control network having a first output terminal and a second output terminal;
a first switch having a control terminal, a first conduction terminal, and a second conduction terminal, the control terminal of the first switch coupled for receiving a first clock signal from the switch control network;
a second switch having a control terminal, a first conduction terminal, and a second conduction terminal, the control terminal of the second switch coupled for receiving a second clock signal from the switch control network;
a driver having a first input, a second input, and an output, the first input of the driver coupled to the first current conduction terminal of the second switch;
a first energy storage element having a first terminal and a second terminal, the second terminal of the first energy storage element coupled to the first conduction terminal of the first switch and the second terminal of the first energy storage element coupled to the second conduction terminal of the second switch; and
a second energy storage element having a first terminal and a second terminal, the first terminal of the second energy storage element coupled to the first input of the driver and the second terminal of the second energy storage element coupled to the second input of the driver.

7. The transformer-less drive circuit of claim 6, further including a third switch having a control terminal, a first conduction terminal, and a second conduction terminal, the control terminal of the third switch coupled for receiving the second clock signal from the switch control network, the first conduction terminal of the third switch coupled for receiving an input voltage, and the second conduction terminal of the third switch coupled to the first input of the driver.

8. The transformer-less drive circuit of claim 7, further including a fourth switch having a control terminal, a first conduction terminal, and a second conduction terminal, the control terminal of the fourth switch coupled for receiving the first clock signal from the switch control network, the first conduction terminal of the fourth switch coupled to the first conduction terminal of the third switch, and the second conduction terminal of the fourth switch coupled to the second conduction terminal of the second switch.

9. The transformer-less drive circuit of claim 8, further including a fifth switch having a control terminal, a first conduction terminal, and a second conduction terminal, the control terminal of the fifth switch coupled for receiving the second clock signal from the switch control network, the first conduction terminal of the fifth switch coupled to the first conduction terminal of the first switch, and the second conduction terminal of the fifth switch coupled to the second input of the driver.

10. The transformer-less drive circuit of claim 9, further including:
a sixth switch having a control terminal, a first conduction terminal, and a second conduction terminal, the control terminal of the sixth switch coupled for receiving a third clock signal from the switch control network, the first conduction terminal of the sixth switch coupled to the first input of the driver, and the second conduction terminal of the sixth switch coupled for receiving the first reference voltage; and
a seventh switch having a control terminal, a first conduction terminal, and a second conduction terminal, the control terminal of the seventh switch coupled for receiving a fourth clock signal from the switch control network, the first conduction terminal of the seventh switch coupled for receiving the first reference voltage, and the second conduction terminal of the seventh switch coupled to the second input of the driver.

11. A transformer-less drive circuit, comprising:
a switch control network having a first output terminal and a second output terminal;

a first switch having a control terminal, a first conduction terminal, and a second conduction terminal, the control terminal of the first switch coupled for receiving a first clock signal from the switch control network;

a second switch having a control terminal, a first conduction terminal, and a second conduction terminal, the control terminal of the second switch coupled for receiving a second clock signal from the switch control network;

a driver having a first input, a second input, and an output, the first input of the driver coupled to the first current conduction terminal of the second switch;

a third switch having a control terminal, a first conduction terminal and a second conduction terminal, the control terminal of the third switch coupled for receiving the second clock signal from the switch control network, the first conduction terminal of the third switch coupled to the second input terminal of the driver, and the second conduction terminal of the third switch coupled for receiving a first reference voltage;

a fourth switch having a control terminal, a first conduction terminal and a second conduction terminal, the control terminal of the fourth switch coupled for receiving the first clock signal from the switch control network, the first conduction terminal of the fourth switch coupled for receiving an input voltage, and the second conduction terminal of the fourth switch coupled to the second conduction terminal of the second switch;

a fifth switch having a control terminal, a first conduction terminal and a second conduction terminal, the control terminal of the fifth switch coupled for receiving the second clock signal from the switch control network, the first conduction terminal of the fifth switch coupled for receiving an input voltage, and the second conduction terminal of the fifth switch coupled to the first conduction terminal of the first switch;

a sixth switch having a control terminal, a first conduction terminal and a second conduction terminal, the control terminal of the sixth switch coupled for receiving the first clock signal from the switch control network, the first conduction terminal of the sixth switch coupled to the first input of the driver, and the second conduction terminal of the sixth switch coupled for receiving a second reference voltage.

12. A method for generating a drive signal, comprising:
configuring a plurality of switches to generate a first voltage at a first node, a second voltage at a second node, and a third voltage at a third node, wherein configuring the plurality of switches to generate the first voltage at the first node and the second voltage at the second node includes generating a first difference voltage across a first capacitor equal to a difference between the first voltage and the second voltage and wherein the second voltage is substantially equal to the third voltage;

configuring the plurality of switches to generate the first voltage at the second node, a fourth voltage at the first node and the third node, and a fifth voltage at a fourth node; and configuring the plurality of switches to generate the first voltage at the first node, the second voltage at the second node, the third voltage at the third node, and a sixth voltage at the fourth node.

13. The method of claim 12, wherein configuring the plurality of switches to place the first voltage at the second node, the fourth voltage at the first node and the third node, and the fifth voltage at the fourth node includes increasing the voltage at the first node to the fourth voltage, and further includes generating a second difference voltage across a second capacitor equal to a difference between the voltage at the third node and the voltage at the fourth node, wherein the voltage at the third node is substantially equal to two times the first voltage minus the second voltage, and wherein the voltage at the fourth node is equal to the second voltage.

14. The method of claim 13, wherein configuring the plurality of switches to generate the first voltage at the first node, the second voltage at the second node, the third voltage at the third node, and the sixth voltage at the fourth node includes generating the sixth voltage to be a negative voltage equal to a difference between a voltage at the third node and a voltage across the second energy storage element.

15. The method of claim 12, further including generating a drive signal that is at a voltage level that is between the voltage at the third node and the voltage at the fourth node.

16. A method for generating a drive signal, comprising:
providing a switch control network having a first output terminal and a second output terminal; a first switch having a control terminal, a first conduction terminal, and a second conduction terminal, the control terminal of the first switch coupled for receiving a first clock signal from the switch control network; a second switch having a control terminal, a first conduction terminal, and a second conduction terminal, the control terminal of the second switch coupled for receiving a second clock signal from the switch control network; and a driver having a first input, a second input, and an output, the first input of the driver coupled to the first current conduction terminal of the second switch;

providing a first energy storage element and a second energy storage element, the first energy storage element having a first terminal coupled to the second current conduction terminal of the second switch and a second terminal coupled to the first conduction terminal of the first switch, and the second energy storage element having a first terminal coupled to the first conduction terminal of the second switch and a second terminal switchably coupled to the second conduction terminal of the first switch;

generating a first voltage at a first voltage level at the second current conduction terminal of the second switch and a second voltage at a second voltage level at the first conduction terminal of the first switch and a third voltage at a third voltage level at the first conduction terminal of the second switch, wherein a difference between the first voltage and the second voltage is stored across the first energy storage element;

increasing the voltage at the first conduction terminal of the first switch to a first voltage level, wherein increasing the voltage at the first conduction terminal of the first switch increases the voltage at the second current conduction terminal of the second switch and the voltage at the first conduction terminal of the second switch to a fourth voltage level; and using the voltage at the first conduction terminal of the second switch to drive the driver.

17. The method of claim 16, further including changing the voltage at the first conduction terminal of the second switch from the fourth voltage level to the second voltage level then using the voltage across the second energy storage element to supply the driver.

18. The method of claim 16, further including alternately setting the voltage at the first conduction terminal of the second switch and the second conduction terminal of the first switch at the second voltage level.

* * * * *